(12) United States Patent
Choi et al.

(10) Patent No.: US 11,871,638 B2
(45) Date of Patent: Jan. 9, 2024

(54) DISPLAY DEVICE WITH TOUCH UNIT HAVING REFLECTION PREVENTION UNIT OVERLAPPING VALLEY

(71) Applicant: SAMSUNG DISPLAY CO., LTD., Yongin-si (KR)

(72) Inventors: Wonjun Choi, Yongin-si (KR); Iljoo Kim, Yongin-si (KR); Youngbae Jung, Yongin-si (KR); Duckjoong Kim, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/649,283

(22) Filed: Jan. 28, 2022

(65) Prior Publication Data

US 2022/0157894 A1 May 19, 2022

Related U.S. Application Data

(63) Continuation of application No. 16/726,356, filed on Dec. 24, 2019, now Pat. No. 11,239,287.

(30) Foreign Application Priority Data

Dec. 27, 2018 (KR) ........................ 10-2018-0171136

(51) Int. Cl.
*H10K 59/40* (2023.01)
*H10K 50/86* (2023.01)
(Continued)

(52) U.S. Cl.
CPC ........... *H10K 59/40* (2023.02); *H10K 50/844* (2023.02); *H10K 50/86* (2023.02); *H10K 59/124* (2023.02); *H10K 59/131* (2023.02)

(58) Field of Classification Search
CPC .... H10K 59/40; H10K 59/131; H10K 59/124; H10K 50/86; H10K 50/844
See application file for complete search history.

(56) References Cited

U.S. PATENT DOCUMENTS 8,717,321 B2  5/2014 Kim
9,837,629 B2  12/2017 Yun et al.
(Continued)

FOREIGN PATENT DOCUMENTS

EP  3522229   8/2019
JP  3180899   12/2012
(Continued)

*Primary Examiner* — Lex H Malsawma
(74) *Attorney, Agent, or Firm* — F. CHAU & ASSOCIATES, LLC

(57) ABSTRACT

Provided is a display device in which a defect by external light reflection is minimized in a non-display area. The display device includes a display panel and a touch unit arranged on the display panel. The display panel may include: a substrate including a display area and a non-display area arranged around the display area; an insulator including a valley portion, the valley portion being defined as an opening arranged along an outer side of the display area in the non-display area; and a display unit arranged in the display area and including a light-emitting element electrically connected to a thin film transistor. The touch unit may include a reflection prevention unit that overlaps the valley portion and is configured to reduce reflectivity of external light.

20 Claims, 16 Drawing Sheets

(51) Int. Cl.
  *H10K 50/844* (2023.01)
  *H10K 59/124* (2023.01)
  *H10K 59/131* (2023.01)

(56) References Cited

U.S. PATENT DOCUMENTS

| | | |
|---|---|---|
| 10,036,917 B2 | 7/2018 | Park |
| 11,239,287 B2 * | 2/2022 | Choi ................. G06F 3/0448 |
| 2010/0007632 A1 | 1/2010 | Yamazaki |
| 2010/0182267 A1 | 7/2010 | Lee et al. |
| 2013/0176279 A1 | 7/2013 | Chen et al. |
| 2016/0266695 A1 | 9/2016 | Bae et al. |
| 2017/0161543 A1 | 6/2017 | Smith et al. |
| 2018/0188862 A1 | 7/2018 | Lin et al. |
| 2019/0235299 A1 | 8/2019 | Mazeki et al. |
| 2019/0303639 A1 | 10/2019 | He et al. |
| 2019/0305072 A1 | 10/2019 | Park et al. |
| 2019/0348476 A1 | 11/2019 | Kato |
| 2020/0050818 A1 | 2/2020 | He et al. |
| 2020/0212115 A1 | 7/2020 | Choi et al. |
| 2020/0241699 A1 | 7/2020 | Maeda et al. |
| 2020/0258947 A1 | 8/2020 | Chung et al. |
| 2021/0124461 A1 | 4/2021 | Tominaga et al. |

FOREIGN PATENT DOCUMENTS

| | | |
|---|---|---|
| KR | 10-1040802 | 6/2011 |
| KR | 10-1550481 | 8/2015 |
| KR | 10-2017-0134842 | 12/2017 |
| KR | 10-1868473 | 6/2018 |
| WO | 2018142739 | 8/2018 |

* cited by examiner

DISPLAY DEVICE WITH TOUCH UNIT HAVING REFLECTION PREVENTION UNIT OVERLAPPING VALLEY

CROSS-REFERENCE TO RELATED APPLICATION

This application is a continuation of U.S. application Ser. No. 16/726,356, filed on Dec. 24, 2019, which claims the benefit under 35 U.S.C. § 119 of Korean Patent Application No. 10-2018-0171136, filed on Dec. 27, 2018, in the Korean Intellectual Property Office, the disclosures of which are incorporated by reference herein in their entirety.

TECHNICAL FIELD

Example embodiments of the present disclosure relate to a display device, and more particularly, to a display device in which a defect by external light reflection in a non-display area is minimized.

DISCUSSION OF RELATED ART

Among various display devices, an organic light emitting display device has brilliant colors, wide viewing angles, excellent contrast, and fast response speeds, and thus, is in the limelight as a next-generation display device.

Generally, an organic light-emitting display device includes thin film transistors and organic light-emitting diodes formed on a substrate, and the organic light-emitting diodes operate by emitting light in response to electrical currents supplied by the thin film transistors. The organic light-emitting display device may be used as a display unit of miniaturized products such as mobile phones, or used as a display unit of large-scale products such as televisions.

The organic light-emitting display device may include a display area in which pixels are arranged and a non-display area located outside the display area. Since the non-display area of the organic light-emitting display device is usually formed along edges of the substrate, structures for preventing external moisture transmission are arranged. Problems may arise from the formation of these structures for preventing external moisture transmission such as, for example, external light may be reflected by the structures and light leakage may occur inside the non-display area.

SUMMARY

Example embodiments of the present disclosure include a display device in which a defect by external light reflection in a non-display area is minimized. However, it should be understood that the example embodiments described herein should be considered in a descriptive sense only and not for limitation of the present disclosure.

Additional aspects will be set forth in part in the description which follows and, in part, will be apparent from the description, or may be learned by practice of the presented example embodiments.

According to an example embodiment of the present disclosure, a display device includes: a display panel and a touch unit arranged on the display panel. The display panel may include: a substrate including a display area and a non-display area arranged around the display area; an insulator including a valley portion, the valley portion being defined as an opening arranged along an outer side of the display area in the non-display area; and a display unit arranged in the display area and including a light-emitting element electrically connected to a thin film transistor. The touch unit may include a reflection prevention unit that overlaps the valley portion and is configured to reduce reflectivity of external light.

The touch unit may be directly arranged on the display panel, and may include: a sensing electrode corresponding to the display area; and a signal line corresponding to the non-display area and electrically connected to the sensing electrode.

The sensing electrode may include: a first conductive layer; a second conductive layer arranged over the first conductive layer; a first insulating layer arranged between the first conductive layer and the second conductive layer; and a second insulating layer arranged on the second conductive layer.

The reflection prevention unit may include a material the same as that of the second conductive layer.

The sensing electrode may have a mesh shape.

The sensing electrode may include a first sensing electrode and a second sensing electrode intersecting the first sensing electrode, and the signal line may include: a first signal line connected to the first sensing electrode and a second signal line connected to the second sensing electrode.

At least a portion of the signal line may overlap the valley portion.

The reflection prevention unit may include at least a portion of the signal line.

The touch unit may further include: a dummy layer, to which an electric signal is not applied, arranged on an outer side of the signal line, with at least a portion of the dummy layer overlapping the valley portion.

The reflection prevention unit may include at least a portion of the dummy layer.

The touch unit may further include: an electrostatic discharge prevention line arranged on an outer side of the signal line, with at least a portion of the electrostatic discharge prevention line overlapping the valley portion.

The reflection prevention unit may include at least a portion of the electrostatic discharge prevention line.

The touch unit may further include: a guard line arranged at an outermost portion of the signal line and configured to prevent a signal interference on the signal line, with at least a portion of the guard line overlapping the valley portion.

The reflection prevention unit may include at least a portion of the guard line.

A width of the reflection prevention unit may be greater than a width of the valley portion.

The light-emitting element may include: a pixel electrode, a common electrode arranged on the pixel electrode, and an emission layer arranged between the pixel electrode and the common electrode. The display panel may further include: an encapsulation unit arranged on the common electrode, the encapsulating unit including a first inorganic encapsulation layer, a second inorganic encapsulation layer arranged over the first inorganic encapsulation layer, and an organic encapsulation layer arranged between the first inorganic encapsulation layer and the second inorganic encapsulation layer. The touch unit may be arranged on the second inorganic encapsulation layer.

The common electrode may extend to a portion of the non-display area, and may cover the valley portion.

The display area of the display panel may include a round corner portion.

A partial area of the touch unit may have a predetermined curvature to correspond to a shape of the display area.

The insulator may further include: a first insulating layer; and a second insulating layer arranged on the first insulating layer. The valley portion may include a first opening defined in the first insulating layer and a second opening defined in the second insulating layer.

The display unit may further include: a planarization layer arranged on the thin film transistor to cover the thin film transistor; and a pixel-defining layer arranged on the planarization layer and including an opening defining an emission area of the light-emitting element, in which the first insulating layer may include a material the same as that of the planarization layer, and the second insulating layer may include a material the same as that of the pixel-defining layer.

The insulator may further include: a first insulating layer; a second insulating layer arranged on the first insulating layer; and a third insulating layer arranged on the second insulating layer. The valley portion may include: a first opening defined in the first insulating layer; a second opening defined in the second insulating layer; and a third opening defined in the third insulating layer.

The display unit may further include: a first planarization layer arranged on the thin film transistor to cover the thin film transistor; a second planarization layer arranged on the first planarization layer; and a pixel-defining layer arranged on the second planarization layer and including an opening defining an emission area of the light-emitting element, in which the first insulating layer may include a material the same as that of the first planarization layer, the second insulating layer may include a material the same as that of the second planarization layer, and the third insulating layer may include a material the same as that of the pixel-defining layer.

The valley portion may surround an outer portion of the display area in a plan view, and may have a shape in which at least one side thereof is open.

The valley portion may have a stepped structure of two or more steps.

An inner surface of the valley portion may have a tapered inclined surface.

According to an example embodiment of the present disclosure, a display device includes: a substrate including a display area and a non-display area arranged around the display area; a display unit arranged in the display area and including a light-emitting element electrically connected to a thin film transistor; an insulator extending from the display area and including a valley portion defined as an opening arranged along an outer side of the display area, with at least a portion of the insulator being arranged in the non-display area; an encapsulation unit including at least one inorganic layer and at least one organic layer and arranged on the light-emitting element to encapsulate the light-emitting element; and a touch unit arranged on the encapsulation unit and including a sensing electrode corresponding to the display area, a signal line corresponding to the non-display area and connected to the sensing electrode, and a dummy layer arranged on one side of the signal line, the dummy layer overlapping the valley portion.

The sensing electrode may include a plurality of first sensing electrodes and a plurality of second sensing electrodes, the signal line may include a plurality of first signal lines respectively connected to the plurality of first sensing electrodes and a plurality of second signal lines respectively connected to the plurality of second sensing electrodes, and the dummy layer may be arranged between a first signal line arranged at an outermost portion among the plurality of first signal lines, and a second signal line arranged at an outermost portion among the plurality of second signal lines.

According to an example embodiment of the present disclosure, a display device includes: a substrate including a display area and a non-display area arranged around the display area; a display unit arranged in the display area and including a light-emitting element electrically connected to a thin film transistor; an insulator extending from the display area and including a valley portion defined as an opening arranged along an outer side of the display area, with at least a portion of the insulator being arranged in the non-display area; an encapsulation unit including at least one inorganic layer and at least one organic layer and arranged on the light-emitting element to encapsulate the light-emitting element; and a touch unit arranged on the encapsulation unit and including a reflection prevention unit configured to reduce reflectivity of external light, in which, in a plan view, the reflection prevention unit may include at least a first portion which overlaps an entirety of the valley portion, and a second portion which surrounds the first portion and does not overlap the valley portion.

The touch unit may include: a sensing electrode corresponding to the display area; and a signal line corresponding to the non-display area and electrically connected to the sensing electrode, in which the reflection prevention unit may include at least one of a part of the signal line, a part of a guard line, a part of an electrostatic discharge prevention line, and a part of a dummy layer arranged on one side of the signal line.

BRIEF DESCRIPTION OF THE DRAWINGS

These and/or other aspects of the present disclosure will become apparent and more readily appreciated from the following description of the embodiments, taken in conjunction with the accompanying drawings in which.

Figure 1:
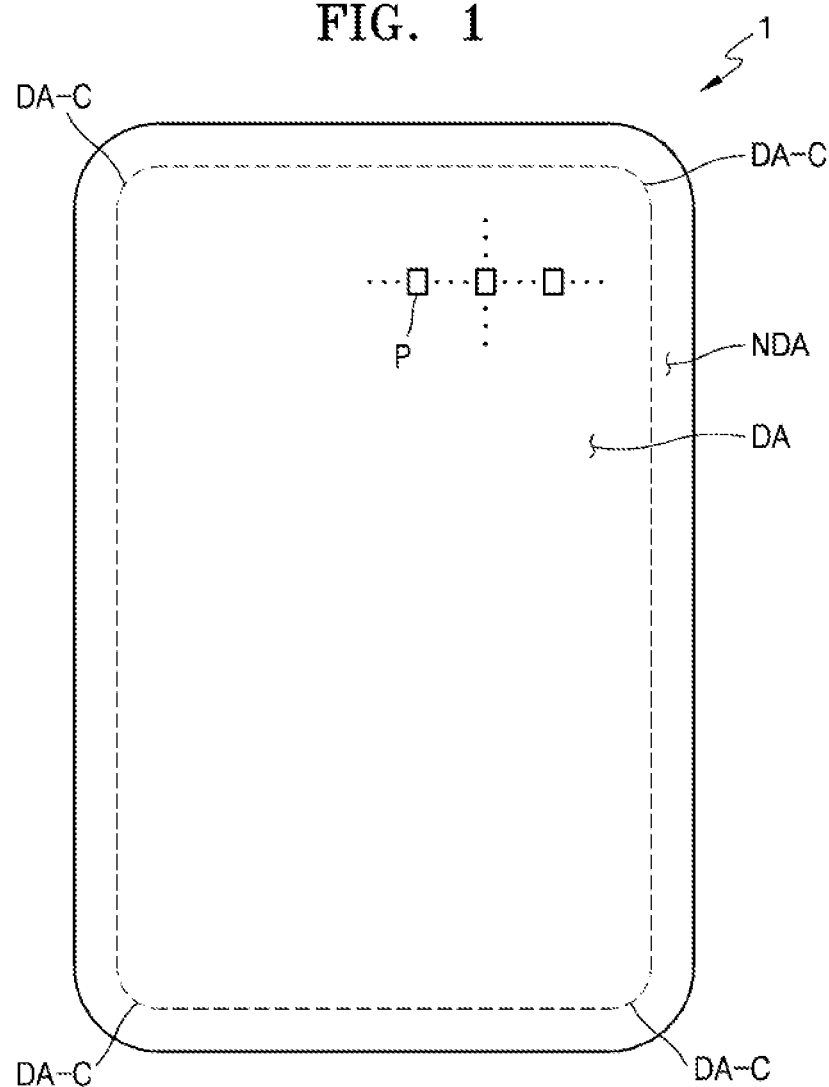
FIG. 1 is a plan view of a display device according to an example embodiment of the present disclosure.

Since the drawings in FIGS. 1-18 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

As the disclosure allows for various changes and numerous embodiments, example embodiments of the present disclosure will be illustrated in the drawings and described in detail in the written description. An effect and a characteristic of the present disclosure, and a method of accomplishing these will be apparent when referring to example embodiments described with reference to the drawings. The present disclosure may, however, be embodied in many different forms and should not be construed as limited to the specific example embodiments set forth herein.

Hereinafter, the present disclosure will be described more fully with reference to the accompanying drawings, in which example embodiments of the present disclosure are shown. When description is made with reference to the drawings, like reference numerals in the drawings denote like or corresponding elements, and thus repeated description thereof will be omitted.

As used herein, the term "and/or" includes any and all combinations of one or more of the associated listed items.

Expressions such as "at least one of" when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises/includes" and/or "comprising/including" used herein specify the presence of stated features and/or components, but do not preclude the presence or addition of one or more other features and/or components thereof.

It will be understood that when a layer, region, or component is referred to as being "formed on" another layer, region, or component, it can be directly or indirectly formed on the other layer, region, or component. That is, for example, intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another. Also, the x-axis, the y-axis, and the z-axis may correspond to a first direction D1, a second direction D2 and a third direction D3, respectively.

When a certain example embodiment is implemented differently, a specific process order may be performed differently from the described order. For example, two consecutively described processes may be performed substantially at the same time or performed in an order opposite to the described order.

FIG. 1 is a plan view of a display device 1 according to an example embodiment of the present disclosure.

Referring to FIG. 1, the display device 1 according to an example embodiment of the present disclosure includes a display area DA that displays an image and a non-display area NDA that is adjacent to the display area DA. The non-display area NDA is an area in which an image is not displayed. The display area DA may be enclosed by the non-display area NDA. A photo, an image or a time of a moving image, and an image such as an icon may be displayed in the display area DA.

Although an example embodiment of the present disclosure shows the display device 1 including a flat display surface, the present disclosure is not limited thereto. For example, the display device 1 may include a curved display surface or a three-dimensional display surface. The three-dimensional display surface, in which images are generated within a display volume rather than upon a stationary surface, may include a plurality of display areas, for example, a polyprism surface. The plurality of display areas may be oriented in different directions.

Although the display device 1 according to the present example embodiment may include a flexible display device, the present disclosure is not limited thereto, and the display device 1 according to an example embodiment of the present disclosure may include a rigid display device 1. The present example embodiment has shown, as an example, the display device 1 applicable to a mobile phone. Electronic modules, a camera module, a power module, etc. mounted on a mainboard may be arranged in a bracket/case together with the display device 1 to constitute a mobile phone. The display device 1 according to an example embodiment of the present disclosure is applicable to not only large-scale electronic devices such as, for example, televisions and monitors, but also small and medium-sized electronic devices such as, for example, tablets, automobile navigation devices, game consoles, and smartwatches.

As shown in FIG. 1, the display area DA of the display device 1 may approximately have a quadrangular shape. Four corner portions DA-C of the display area DA may have a round shape having a predetermined curvature. Thus, a partial area of a touch unit TU to be described may have a predetermined curvature to correspond to the shape of the display area DA. The non-display area NDA may surround the display area DA, and may also have a quadrangular shape with four rounded corners. However, the present disclosure is not limited thereto, and a shape of the display area DA and a shape of the non-display area NDA may have various shapes and may be designed relatively.

Figure 2:
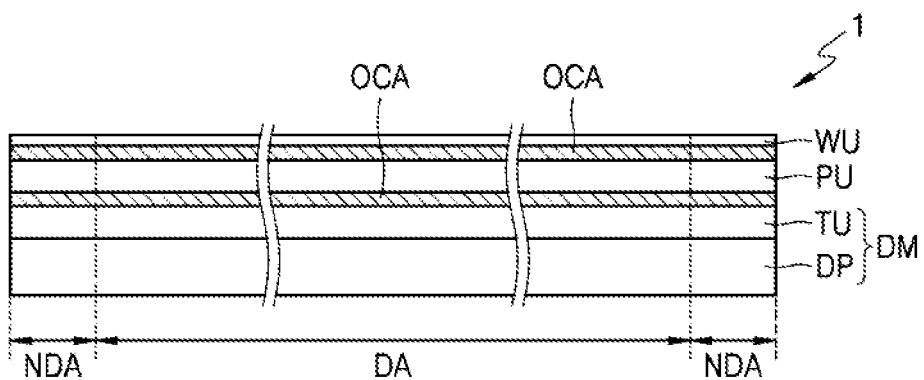
FIG. 2 is a cross-sectional view of the display device of FIG. 1.

FIG. 2 is a cross-sectional view of the display device 1 of FIG. 1, and is simply shown to explain a stacked relation of a functional panel and/or functional units constituting the display device 1.

Referring to FIG. 2, the display device 1 according to an example embodiment of the present disclosure may include a display panel DP, a touch unit TU, a polarization unit PU, and a window unit WU, and may be sequentially formed. However, the present disclosure is not limited thereto. At least some elements of the display panel DP, the touch unit TU, the polarization unit PU, and the window unit WU may be formed by a successive process, or coupled to each other through an adhesive member. FIG. 2 shows, as an example, an optically clear adhesive OCA as an adhesive member. An adhesive described below may include a general adhesive or cohesive agent. The optically clear adhesive OCA may be formed from a pre-coated film or from a liquid paste. In general, the optically clear adhesive OCA may require optical clarity and may provide shock resistance. In an example embodiment of the present disclosure, the polarization unit PU and the window unit WU may be replaced by a different element or may be omitted.

The touch unit TU is directly arranged on the display panel DP. In the present specification, when an element B is directly arranged on an element A, a separate adhesive layer/adhesive member is not arranged between the element A and the element B. The element B is formed on a base surface of the element A through a successive process after the element A is formed.

A display module DM may be defined by including the display panel DP and the touch unit TU directly arranged on the display panel DP. Optically clear adhesives OCA are respectively arranged between the display module DM and the polarization unit PU, and between the polarization unit PU and the window unit WU.

The display panel DP produces an image, and the touch unit TU obtains coordinate information of an external input (e.g. a touch event). The display module DM according to an example embodiment of the present disclosure may further include a protective member arranged on a back surface of the display panel DP. The protective member and the display panel DP may be coupled to each other through an adhesive member.

The display panel DP according to an example embodiment of the present disclosure may include a light-emissive display panel and is not particularly limited. For example, in an example embodiment of the present disclosure, the display panel DP may include an organic light-emitting display panel or a quantum dot light-emitting display panel. An emission layer of the organic light-emitting display panel may include an organic light-emitting material. An emission layer of the quantum dot light-emitting display panel may include a quantum dot and a quantum rod. The quantum dot and the quantum rod may be small semiconductor particles which are several nanometers in size. Hereinafter, the display panel DP is described as an organic light-emitting display panel.

The polarization unit PU reduces reflectivity of external light incident from above the window unit WU. The polarization unit PU according to an example embodiment of the present disclosure may include a retarder and a polarizer. The retarder may include a film-type retarder or a liquid crystal-type retarder. The retarder may include a $\lambda/2$ retarder and/or a $\lambda/4$ retarder. In an example embodiment of the present disclosure, the polarization unit PU may include two layers of retarder with a first retarder having a $\lambda/2$ retardation value, and a second retarder positioned below the first retarder and having a $\lambda/4$ retardation value. Also, the polarizer may include a film-type polarizer or a liquid crystal-type polarizer. The film-type polarizer may include a stretchable synthetic resin film, and the liquid crystal-type polarizer may include liquid crystals arranged in a predetermined arrangement. The film-type polarizer may be a uniaxially stretched film or a biaxially stretched film. Each of the retarder and the polarizer may further include a protective film. For example, the polarizer may be interposed between two protective films. The retarder and the polarizer themselves or their protective films may be defined as a base layer of the polarization unit PU.

Structures of the display panel DP and the touch unit TU are described in detail below.

Figure 3:
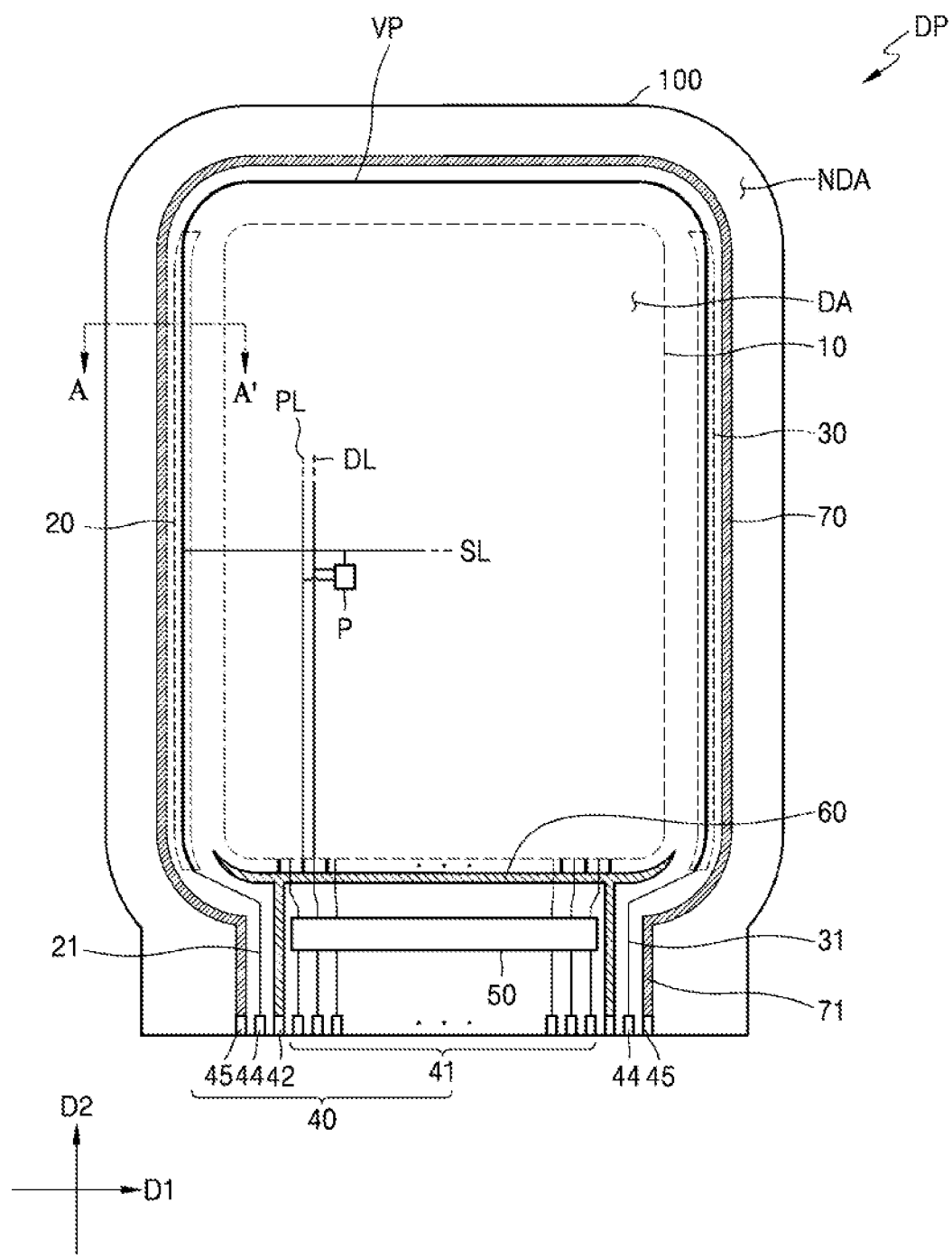
FIG. 3 is a plan view of a display panel of the display device of FIG. 1.

FIG. 3 is a plan view of the display panel DP of the display device 1 of FIG. 1.

Referring to FIG. 3, the display panel DP includes a display unit 10, first and second scan drivers 20 and 30, a terminal unit 40, a data driver 50, a driving voltage supply line 60, and a common voltage supply line 70 arranged over a substrate 100.

The substrate 100 may include a material such as, for example, glass containing silicon oxide ($SiO_2$) as a main component, a metal, or an organic material. In an example embodiment of the present disclosure, the substrate 100 may include a flexible material. For example, although the substrate 100 may include a flexible plastic material such as polyimide, the present disclosure is not limited thereto.

In an example embodiment of the present disclosure, the plastic material may include, for example, polyethersulfone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), cellulose acetate propionate (CAP), cyclic olefin polymer, and cyclic olefin copolymer.

The display unit 10 includes pixels P, each being connected to a scan line SL extending in a first direction D1, and a data line DL and a driving voltage line PL extending in a second direction D2 that intersects the first direction D1. For example, the scan lines SL may be spaced apart from each other in the second direction D2 and extending in the first direction D1, while the data lines DL and the driving voltage lines PL may be spaced apart from each other in the first direction D1 and extending in the second direction D2.

Each pixel P emits, for example, red, green, blue, or white light. In an example embodiment of the present disclosure, each pixel P may include an organic light-emitting diode. The display unit 10 produces a predetermined image through light emitted from the pixels P. A display area DA is defined by the pixels P. In an example embodiment of the present disclosure, the pixels P may be arranged in a matrix shape, but the present disclosure is not limited thereto. For example, the pixels P may be arranged in a pentile matrix shape, or a diamond shape. In the present specification, the non-display area NDA is an area in which the pixels P are not arranged and is an area that does not produce an image.

Although the display unit 10 approximately has a quadrangular shape, the present disclosure is not limited thereto. For example, the display unit 10 may be provided in a polygonal shape, a circular shape, an elliptical shape, or a shape corresponding to a portion of these in various example embodiments of the present disclosure. In the present example embodiment, the display unit 10 has a quadrangular shape entirely and may have a round corner portion, in which each edge is curved. For example, the display area DA of the display panel DP may include a round corner portion. The substrate 100 over which the display unit 10 is located may have curved edges in at least a partial area of an outer edge. The display unit 10 may have a flat surface or a curved surface.

The first and second scan drivers 20 and 30 are each arranged in the non-display area NDA of the substrate 100 and generate and transfer a scan signal to each pixel P through a scan line SL. In an example embodiment of the present disclosure, the first scan driver 20 may be arranged on the left of the display unit 10, and the second scan driver 30 may be arranged on the right of the display unit 10. Although the present example embodiment shows a structure in which the first and second scan drivers 20 and 30 are respectively arranged on two opposite sides of the display unit 10, a scan driver may be arranged on only one side of the display unit 10 according to an example embodiment of the present disclosure.

The terminal unit 40 is arranged on one end of the substrate 100 and includes a plurality of terminals 41, 42, 43, 44, and 45. The terminal unit 40 is not covered by an insulating layer and is exposed, and may be electrically connected to a controller such as, for example, a flexible printed circuit board or an integrated circuit (IC) chip, etc.

The controller changes a plurality of video signals transferred from the outside to a plurality of video data signals, and transfers the changed video signals to the data driver 50 through a terminal 41. Also, the controller may receive a vertical synchronization signal, a horizontal synchronization signal, and a clock signal, generate control signals for controlling driving of the first and second scan drivers 20 and 30, and the data driver 50, and transfer the relevant control signals to the relevant elements. For example, the control signals provided by the controller to the first and second scan drivers 20 and 30 may include a vertical synchronization signal for controlling the operation of the first and second scan drivers 20 and 30, and at least one clock signal for determining the output timing of signals. The controller respectively transfers a driving voltage ELVDD and a common voltage ELVSS to the driving voltage supply line 60 and the common voltage supply line 70 through the terminals 42 and 45.

The data driver 50 is arranged in the non-display area NDA of the substrate 100 and generates and transfers a data signal to each pixel PX through the data line DL. The data driver 50 may be arranged on one side of the display unit 10, for example, between the terminal unit 40 and the display unit 10.

The driving voltage supply line 60 is arranged in the non-display area NDA. For example, the driving voltage supply line 60 may be arranged between the data driver 50 and the display unit 10. The driving voltage supply line 60 provides the driving voltage ELVDD to the pixels P. The driving voltage supply line 60 may extend in the first direction D1 and may be connected to a plurality of driving voltage lines PL arranged in the first direction D1 and extending in the second direction D2.

The common voltage supply line 70 is arranged in the non-display area NDA and provides the common voltage ELVSS to a common electrode 230 (see FIGS. 7 to 9) of an organic light-emitting diode of a pixel P. For example, the common voltage supply line 70 has a loop shape in which one side thereof is open and may extend along edges of the substrate 100 except for the terminal unit 40. For example, the loop shape of the common voltage supply line 70 may have one side, at which the terminal unit 40 is located, being open.

A valley portion VP may be arranged in the non-display area NDA along an outer side of the display area DA. The valley portion VP may be arranged between the display unit 10 and the common voltage supply line 70. The valley portion VP overlaps the first and second scan drivers 20 and 30 (see FIG. 7) in a partial area of the valley portion VP, but the present disclosure is not limited thereto. For example, the valley portion VP may not overlap the first and second scan drivers 20 and 30. In the present specification, when an element A is described to overlap an element B, the element A overlaps the element B in the third direction D3. In an example embodiment of the present disclosure, the valley portion VP may be arranged between an emission control driver and the first and second scan drivers 20 and 30.

The valley portion VP may have a loop shape in which one side thereof is open and may not be formed in a partial area facing the data driver 50. For example, the valley portion VP may surround an outer portion of the display area DA in a plan view and, and may have a shape in which at least one side thereof is open. The valley portion VP is designed for blocking impurities that are introduced to the display area DA by removing a portion of an organic insulating layer ILL (see FIG. 7) extending to the non-display area NDA. The insulating layer ILL may also be referred to as insulator. Since a plurality of wirings are arranged on a side facing the data driver 50, impurities may be easily blocked. In contrast, it is not easy to block impurities in the rest of the areas. Therefore, the valley portion VP as in the present example embodiment may be provided. Thus, the insulator may include the valley portion VP, with the valley portion VP being defined as an opening arranged along an outer side of the display area DA in the non-display area NDA. For example, the valley portion VP is the opening formed in the insulator.

Figure 4:
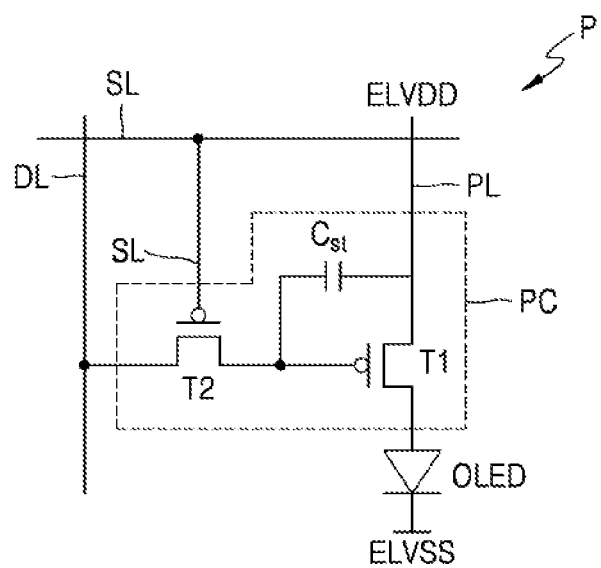
FIG. 4 is an equivalent circuit diagram of a pixel according to an example embodiment of the present disclosure.

FIG. 4 is an equivalent circuit diagram of a pixel P according to an example embodiment of the present disclosure.

Referring to FIG. 4, each pixel P includes a pixel circuit PC connected to the scan line SL and the data line DL, and a light-emitting diode, for example, an organic light-emitting diode OLED, connected to the pixel circuit PC.

The pixel circuit PC includes a driving thin film transistor T1, a switching thin film transistor T2, and a storage capacitor Cst. The switching thin film transistor T2 is connected to the scan line SL and the data line DL and transfers a data signal input through the data line DL to the driving thin film transistor T1 in response to a scan signal Sn input through the scan line SL.

The storage capacitor Cst is connected to the switching thin film transistor T2 and the driving voltage line PL and stores a voltage corresponding to a difference between a voltage transferred from the switching thin film transistor T2 and the driving voltage ELVDD supplied to the driving voltage line PL. For example, the storage capacitor Cst may include a first electrode connected to the switching thin film transistor T2 and a second electrode receiving the driving voltage ELVDD. Also, the storage capacitor Cst may be charged with a voltage corresponding to the data signal received from the switching thin film transistor T2.

The driving thin film transistor T1 is connected to the driving voltage line PL and the storage capacitor Cst and may control a driving current flowing through the organic light-emitting diode OLED from the driving voltage line PL in response to the voltage value stored in the storage capacitor Cst. The organic light-emitting diode OLED may emit light having predetermined brightness by using the driving current.

Although FIG. 4 shows the pixel circuit PC including two thin film transistors T1 and T2 and one storage capacitor Cst, the present disclosure is not limited thereto. For example, in an example embodiment of the present disclosure, a pixel P may include a pixel circuit PC including three or more thin film transistors and two or more capacitors.

Figure 5:
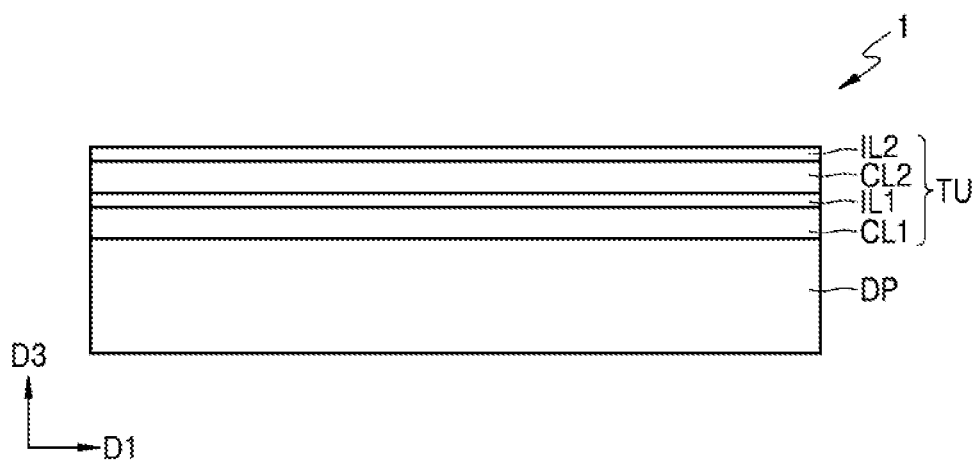
FIG. 5 is a cross-sectional view of a stacked structure of a display panel and a touch unit in the display device according to an example embodiment of the present disclosure.
Figure 6:
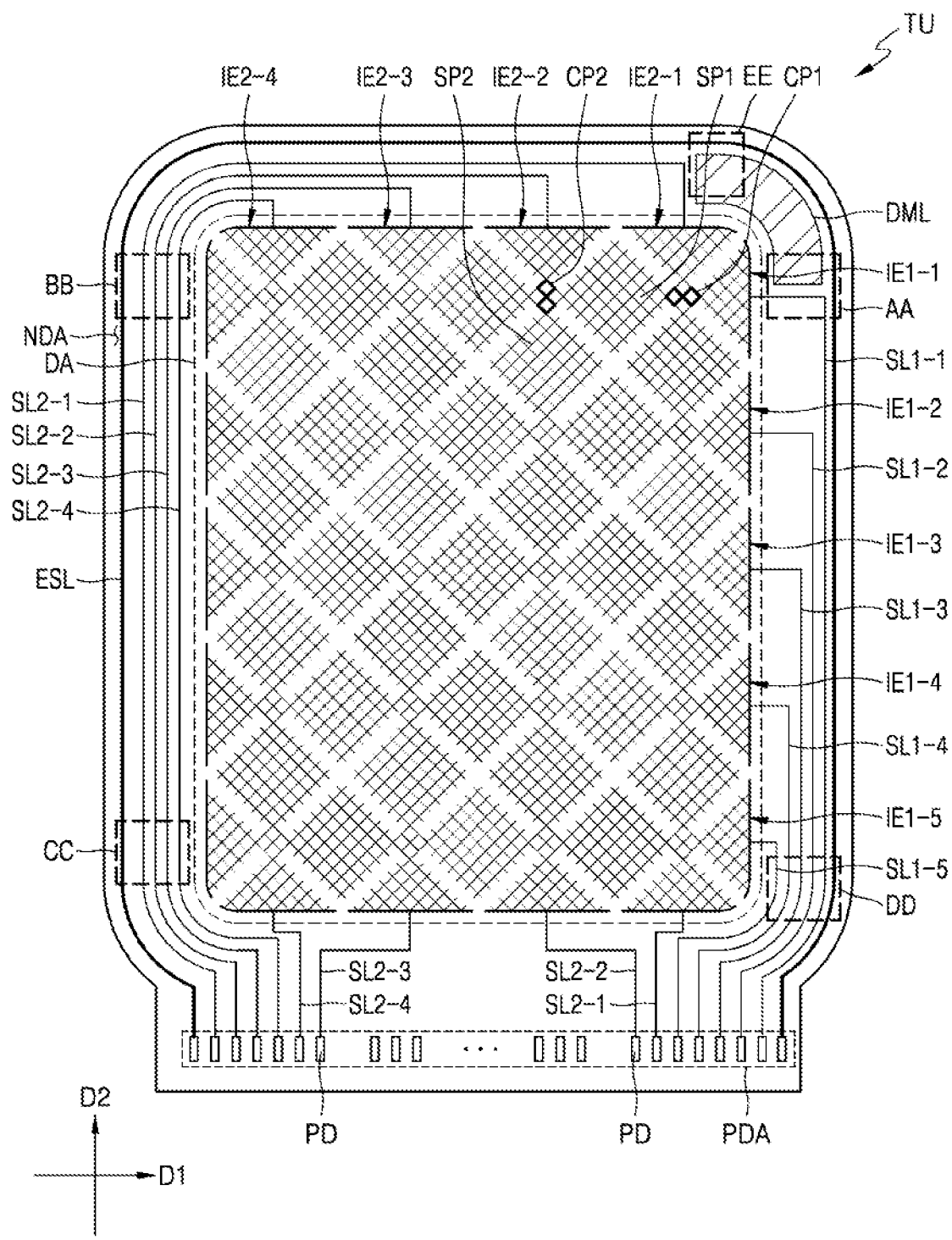
FIG. 6 is a plan view of a touch unit of the display device according to an example embodiment of the present disclosure.

FIG. 5 is a cross-sectional view of a stacked structure of the display panel DP and the touch unit TU in the display device 1 according to an example embodiment of the present disclosure, and FIG. 6 is a plan view of the touch unit TU of the display device 1 according to an example embodiment of the present disclosure.

FIG. 5 shows a cross-section of the stacked structure of the display panel DP and the touch unit TU. FIG. 5 simply shows the display panel DP to explain a stacking relation of the touch unit TU. A polarization unit PU and a window unit WU may be stacked on the touch unit TU as shown in FIG. 2.

The touch unit TU may have a multi-structure. The touch unit TU includes a sensing electrode, a signal line connected to the sensing electrode, and at least one insulating layer. For example, the touch unit TU may be directly arranged on the display panel DP, and may include the sensing electrode corresponding to the display area DA, and the signal line corresponding to the non-display area NDA and electrically connected to the sensing electrode. For example, the sensing electrode may be mainly arranged in the display area DA, and the signal line may be mainly arranged in the non-display area. The touch unit TU may sense an external pressure by using, for example, a capacitance method. In the present disclosure, an operating method of the touch unit TU is not particularly limited. In an example embodiment of the present disclosure, the touch unit TU may sense an external pressure by using an electromagnetic induction method or a pressure sensing method.

As shown in FIG. 5, the touch unit TU according to an example embodiment of the present disclosure may include a first conductive layer CL1, a first insulating layer IL1, a second conductive layer CL2, and a second insulating layer IL2. Each of the first conductive layer CL1 and the second conductive layer CL2 may have a single-layered structure or a stacked multi-layered structure. A conductive layer of a single layer structure may include a metal layer or a transparent conductive layer. The metal layer may include one of, for example, molybdenum (Mo), silver (Ag), titanium (Ti), copper (Cu), aluminum (Al), and an alloy thereof. The transparent conductive layer may include a transparent conductive oxide such as, for example, indium tin oxide (ITO), indium zinc oxide (IZO), zinc oxide (ZnO), and indium tin zinc oxide (ITZO). In addition, the transparent conductive layer may include a conductive polymer such as poly-(3,4)-ethylene-dihydroxy thiophene (PEDOT), a metal nano wire, and graphene.

A conductive layer of the multi-layered structure may include multi-metal layers. The multi-metal layers may have, for example, a three-layered structure of titanium/aluminum/titanium (Ti/Al/Ti). The conductive layer of the multi-layered structure may include at least one metal layer and at least one transparent conductive layer.

Each of the first conductive layer CL1 and the second conductive layer CL2 includes a plurality of patterns. Hereinafter, it is described that the first conductive layer CL1 includes first conductive patterns, and the second conductive layer CL2 includes second conductive patterns. Each of the first conductive patterns and the second conductive patterns may include sensing electrodes and signal lines. On the other hand, the sensing electrodes may each include the first conductive layer CL1 and/or the second conductive layer CL2 in the display area. For example, in the display area DA, the sensing electrode may include the first conductive layer CL1, the second conductive layer CL2 arranged over the first conductive layer CL2, the first insulating layer IL1 arranged between the first conductive layer CL1 and the second conductive layer CL2, and the second insulating layer IL2 arranged on the second conductive layer CL2.

A stacked structure and a material of the sensing electrodes may be determined by taking into account sensing sensitivity. An RC delay may influence sensing sensitivity. Since the sensing electrodes including a metal layer have a resistance lower than that of the sensing electrodes including a transparent conductive layer, an RC value may be reduced. Therefore, a charging time of a capacitor defined between the sensing electrodes may be reduced. The sensing electrodes including the transparent conductive layer are not viewed by a user compared to the sensing electrodes including the metal layer and have an increased input area and thus increase capacitance.

To prevent the sensing electrodes including the metal layer from being viewed by a user, as described below, the sensing electrodes including the metal layer may have a mesh shape. Meanwhile, a thickness of a thin-film encapsulation layer TFE, such as an encapsulation unit 150 (see FIG. 7) to be described, may be adjusted such that a noise generated by elements of a display element layer does not influence the touch unit TU. Each of the first insulating layer IL1 and the second insulating layer IL2 may have a single-layered or multi-layered structure. Each of the first insulating layer IL1 and the second insulating layer IL2 may include an inorganic material, an organic material, or a composite material.

At least one of the first insulating layer IL1 and the second insulating layer IL2 may include an inorganic layer. The inorganic layer may include at least one of, for example, aluminum oxide ($Al_2O_3$), titanium oxide ($TiO_2$), silicon oxide ($SiO_2$), silicon oxynitride (SiON), zirconium oxide ($ZrO_2$), and hafnium oxide ($HfO_2$).

At least one of the first insulating layer IL1 and the second insulating layer IL2 may include an organic layer. The organic layer may include at least one of, for example, an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

As shown in FIG. 6, the touch unit TU may include first sensing electrodes IE1-1, IE1-2, IE1-3, IE1-4, and IE1-5, first signal lines SL1-1, SL1-2, SL1-3, SL1-4, and SL1-5 respectively connected to the first sensing electrodes IE1-1, IE1-2, IE1-3, IE1-4, and IE1-5, second sensing electrodes IE2-1, IE2-2, IE2-3, and IE2-4, and second signal lines SL2-1, SL2-2, SL2-3, and SL2-4 respectively connected to the second sensing electrodes IE2-1, IE2-2, IE2-3, and IE2-4.

The touch unit TU may further include an optical dummy electrode arranged in a boundary area between the first sensing electrodes IE1-1, IE1-2, IE1-3, IE1-4, and IE1-5 and the second sensing electrodes IE2-1, IE2-2, IE2-3, and IE2-4.

Since the thin-film encapsulation layer TFE includes at least one organic encapsulation layer 152 described below with reference to FIG. 7, the thin-film encapsulation layer TFE may provide a base surface that is relatively flat. Therefore, even though the elements of the touch unit TU are formed by successive processes, a defect rate may be reduced. Since the first sensing electrodes IE1-1, IE1-2, IE1-3, IE1-4, and IE1-5 and the second sensing electrodes IE2-1, IE2-2, IE2-3, and IE2-4 are arranged in the display area DA having a reduced step difference, the first sensing electrodes IE1-1, IE1-2, IE1-3, IE1-4, and IE1-5 and the second sensing electrodes IE2-1, IE2-2, IE2-3, and IE2-4 may have a uniform thickness. Here, the step difference may be referred to the vertical portion of the step between steps. The vertical portion may have a vertical surface or an inclined surface. Stress applied to an area overlapping a step difference between the first sensing electrodes IE1-1, IE1-2, IE1-3, IE1-4, and IE1-5 and the second sensing electrodes IE2-1, IE2-2, IE2-3, and IE2-4 may be reduced. Alternatively or in addition, the first signal lines SL1-1, SL1-2, SL1-3, SL1-4, and SL1-5 and the second signal lines SL2-1, SL2-2, SL2-3, and SL2-4 may be arranged in the non-display area NDA with the step difference being reduced, so that they may have a uniform thickness. Stress applied to the regions overlapping a step difference between the first signal lines SL1-1, SL1-2, SL1-3, SL1-4, and SL1-5 and the second signal lines SL2-1, SL2-2, SL2-3, and SL2-4 may be reduced.

The first sensing electrodes IE1-1, IE1-2, IE1-3, IE1-4, and IE1-5 and the second sensing electrodes IE2-1, IE2-2, IE2-3, and IE2-4 intersect each other. The first sensing electrodes IE1-1, IE1-2, IE1-3, IE1-4, and IE1-5 may be arranged to be spaced apart from each other in the second direction D2, and each of the second sensing electrodes IE2-1, IE2-2, IE2-3, and IE2-4 may extend in the first direction D1. The second sensing electrodes IE2-1, IE2-2, IE2-3, and IE2-4 may be arranged to be spaced apart from each other in the first direction D1, and each of the second sensing electrodes IE2-1, IE2-2, IE2-3, and IE2-4 may extend in the second direction D2.

Each of the first sensing electrodes IE1-1, IE1-2, IE1-3, IE1-4, and IE1-5 includes first sensors SP1 and first connectors CP1. Each of the second sensing electrodes IE2-1, IE2-2, IE2-3, and IE2-4 includes second sensors SP2 and second connectors CP2. Two first sensors SP1 respectively arranged at two opposite ends of the first sensing electrodes IE1-1, IE1-2, IE1-3, IE1-4, and IE1-5 among the first sensors SP1 may have a size, for example, a half size, smaller than a size of the first sensors SP1 arranged at the center. Two second sensors SP2 respectively arranged at two opposite ends of the second sensing electrodes IE2-1, IE2-2, IE2-3, and IE2-4 among the second sensors SP2 may have a size, for example, a half size, smaller than a size of the second sensors SP2 arranged at the center.

Although FIG. 6 shows the first sensing electrodes IE1-1, IE1-2, IE1-3, IE1-4, and IE1-5 and the second sensing electrodes IE2-1, IE2-2, IE2-3, and IE2-4 according to an example embodiment of the present disclosure, the shape thereof is not limited. In an example embodiment of the present disclosure, the first sensing electrodes IE1-1, IE1-2, IE1-3, IE1-4, and IE1-5 and the second sensing electrodes IE2-1, IE2-2, IE2-3, and IE2-4 may have a shape (e.g. a bar shape) in which the sensor and the connector are not discriminated. Although the first sensors SP1 and the second sensors SP2, each having a rhombus shape is shown as an example, the present disclosure is not limited thereto. For example, the first sensors SP1 and the second sensors SP2 may have other polygonal shapes.

The first sensors SP1 within each of the first sensing electrodes IE1-1, IE1-2, IE1-3, IE1-4, and IE1-5 are aligned in the first direction D1, and the second sensors SP2 within each of the second sensing electrodes IE2-1, IE2-2, IE2-3, and IE2-4 are aligned in the second direction D2. Each of the first connectors CP1 connects the first sensors SP1 that neighbor each other, and each of the second connectors CP2 connects the second sensors SP2 that neighbor each other.

The first signal lines SL1-1, SL1-2, SL1-3, SL1-4, and SL1-5 are respectively connected to one ends of the first sensing electrodes IE1-1, IE1-2, IE1-3, IE1-4, and IE1-5. The second signal lines SL2-1, SL2-2, SL2-3, and SL2-4 are connected to two opposite ends of the second sensing electrodes IE2-1, IE2-2, IE2-3, and IE2-4. However, the present disclosure is not limited thereto. For example, in an example embodiment of the present disclosure, the first signal lines SL1-1, SL1-2, SL1-3, SL1-4, and SL1-5 may be also connected to two opposite ends of the first sensing electrodes IE1-1, IE1-2, IE1-3, IE1-4, and IE1-5. Also, in an example embodiment of the present disclosure, the second signal lines SL2-1, SL2-2, SL2-3, and SL2-4 may be respectively connected to only one ends of the second sensing electrodes IE2-1, IE2-2, IE2-3, and IE2-4.

Compared to the touch unit TU including the second signal lines SL2-1, SL2-2, SL2-3, and SL2-4 that are respectively connected to only one ends of the second sensing electrodes IE2-1, IE2-2, IE2-3, and IE2-4, according to the present example embodiment as shown in FIG. 6, the second signal lines SL2-1, SL2-2, SL2-3, and SL2-4 are connected to two opposite ends of the second sensing electrodes IE2-1, IE2-2, IE2-3, and IE2-4, and thus sensing sensitivity may be enhanced. Since the second sensing electrodes IE2-1, IE2-2, IE2-3, and IE2-4 are longer than the first sensing electrodes IE1-1, IE1-2, IE1-3, IE1-4, and IE1-5, a voltage drop of a detection signal (or a transmission signal) occurs and thus sensing sensitivity may be reduced. According to the present example embodiment, a detection signal (or a transmission signal) is provided through the second signal lines SL2-1, SL2-2, SL2-3, and SL2-4 connected to two opposite ends of the second sensing electrodes IE2-1, IE2-2, IE2-3, and IE2-4, a voltage drop of a detection signal (or a transmission signal) may be prevented and thus reduction of sensing sensitivity may be prevented.

In an example embodiment of the present disclosure, unlike shown in FIG. 6, the first sensing electrodes IE1-1 to IE1-$n$ may be formed to be longer than the second sensing electrodes IE2-1 to IE2-$m$ (e.g., m>n), and by connecting the first signal lines SL1-1 to SL1-$n$ to two opposite ends of the first sensing electrodes IE1-1 to IE1-$n$ to prevent a voltage drop of a detection signal (or a transmission signal), reduction of sensing sensitivity may be prevented.

The first signal lines SL1-1, SL1-2, SL1-3, SL1-4, and SL1-5 and the second signal lines SL2-1, SL2-2, SL2-3, and SL2-4 each may be connected to a pad unit PD located on one side. The pad unit PD may be aligned in a pad area PDA.

In an example embodiment of the present disclosure, locations of the first signal lines SL1-1, SL1-2, SL1-3, SL1-4, and SL1-5 and the second signal lines SL2-1, SL2-2, SL2-3, and SL2-4 may be exchanged with each other. For example, unlike FIG. 6, the first signal lines SL1-1, SL1-2, SL1-3, SL1-4, and SL1-5 may be arranged on the left, and the second signal lines SL2-1, SL2-2, SL2-3, and SL2-4 may be arranged on the right.

As shown in FIG. 6, the first sensing electrodes IE1-1, IE1-2, IE1-3, IE1-4, and IE1-5 and the second sensing electrodes IE2-1, IE2-2, IE2-3, and IE2-4 may have a mesh shape. Since the first sensing electrodes IE1-1, IE1-2, IE1-3, IE1-4, and IE1-5 and the second sensing electrodes IE2-1, IE2-2, IE2-3, and IE2-4 have a mesh shape, a parasitic capacitance between electrodes of the display panel DP (see FIG. 5) and the first sensing electrodes IE1-1, IE1-2, IE1-3, IE1-4, and IE1-5 and the second sensing electrodes IE2-1, IE2-2, IE2-3, and IE2-4 may be reduced. Also, as described below, since the first sensing electrodes IE1-1, IE1-2, IE1-3, IE1-4, and IE1-5 and the second sensing electrodes IE2-1, IE2-2, IE2-3, and IE2-4 do not overlap emission areas PXA (see FIG. 8), the first sensing electrodes IE1-1, IE1-2, IE1-3, IE1-4, and IE1-5 and the second sensing electrodes IE2-1, IE2-2, IE2-3, and IE2-4 are not viewed by a user of the display device.

The first sensing electrodes IE1-1, IE1-2, IE1-3, IE1-4, and IE1-5 and the second sensing electrodes IE2-1, IE2-2, IE2-3, and IE2-4 having a mesh shape may include one of, for example, silver (Ag), aluminum (Al), copper (Cu), chromium (Cr), nickel (Ni), and titanium (Ti) that may be processed at a low temperature, but the present disclosure is not limited thereto. Due to the low temperature process described above, even though the touch unit TU is formed by successive processes, damage to the organic light-emitting diode OLED (see FIG. 7) may be prevented.

An electrostatic discharge prevention line ESL may be arranged outside the first signal lines SL1-1, SL1-2, SL1-3, SL1-4, and SL1-5 and the second signal lines SL2-1, SL2-2, SL2-3, and SL2-4, that is, arranged at an outermost portion of the touch unit TU. A signal is not applied to the electrostatic discharge prevention line ESL and a constant voltage is applied to the electrostatic discharge prevention line ESL.

Figure 7:
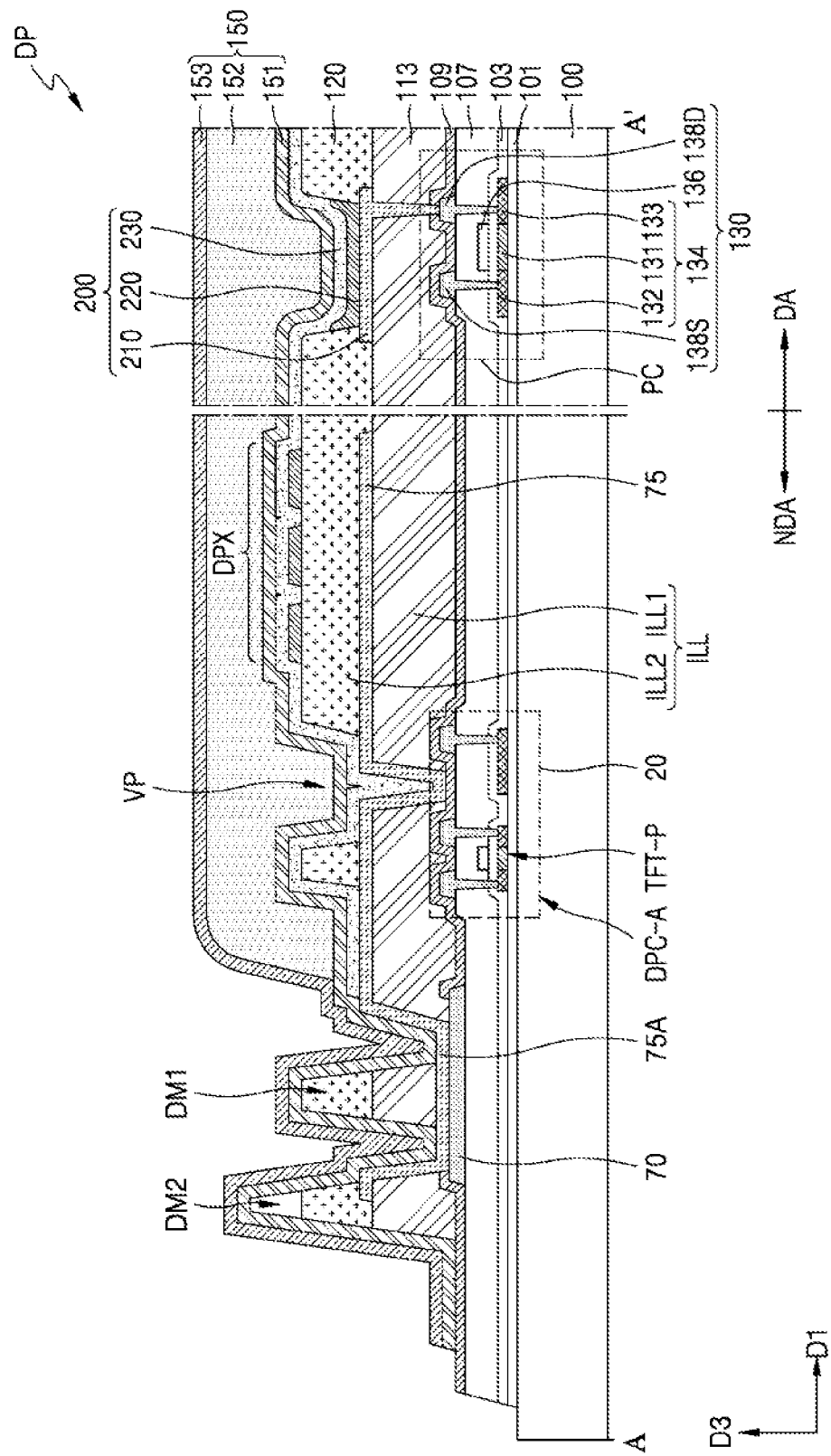
FIG. 7 is a cross-sectional view of a display panel of the display device according to an example embodiment of the present disclosure.

FIG. 7 is a cross-sectional view of the display panel DP of the display device 1 according to an example embodiment of the present disclosure. FIG. 7 is a cross-section view taken along line A-A' of FIG. 3.

Referring to FIG. 7, the display device 1 includes the display area DA and the non-display area NDA (see FIGS. 1-3). The substrate 100 may include areas corresponding to the display area DA and the non-display area NDA.

Referring to the display area DA of FIG. 7, a buffer layer 101 may be formed on the substrate 100. The buffer layer 101 may block foreign substance or moisture penetrating through the substrate 100. For example, the buffer layer 101 may include an inorganic material such as, for example, silicon oxide ($SiO_x$), silicon nitride ($SiN_x$), and/or silicon oxynitride (SiON) and may include a single layer or a multi-layer.

A thin film transistor 130, a storage capacitor, and an organic light-emitting diode OLED, which is a light-emitting diode 200, electrically connected to the thin film transistor 130 and the storage capacitor may be located over the substrate 100. The thin film transistor 130, the storage capacitor, and the organic light-emitting diode OLED are provided at locations corresponding to the display area DA.

The thin film transistor 130 of FIG. 7 may correspond to one of the thin film transistors provided to the pixel circuit PC described with reference to FIG. 4, for example, the driving thin film transistor T1.

The thin film transistor 130 includes a semiconductor layer 134 and a gate electrode 136. The semiconductor layer 134 may include, for example, polycrystalline silicon. The semiconductor layer 134 may include a channel region 131 overlapping the gate electrode 136, and a source region 132 and a drain region 133 respectively arranged on two opposite sides of the channel region 131, with the source region 132 and the drain region 133 being doped with impurities having a concentration higher than that of the channel region 131. Here, the impurities may include N-type impurities or P-type impurities. For example, the N-type impurities may include, for example, phosphorus (P), arsenic (As), or antimony (Sb), and the P-type impurities may include, for example, aluminum (Al), boron (B), or indium (In). The source region 132 and the drain region 133 may be respectively understood as a source electrode and a drain electrode of the thin film transistor 130.

Although the present example embodiment describes the case where the semiconductor layer 134 includes polycrystalline silicon, the present disclosure is not limited thereto. For example, in an example embodiment of the present disclosure, the semiconductor layer 134 may include amorphous silicon or an organic semiconductor material.

A gate insulating layer 103 may be arranged between the semiconductor layer 134 and the gate electrode 136. The gate insulating layer 103 may include an inorganic insulating layer including SiON, $SiO_x$ and/or $SiN_x$, and may include a single layer or a multi-layer. Alternatively, the gate insulating layer 103 may include a high-k dielectric material which may have a dielectric constant higher than that of the silicon oxide ($SiO_x$). For example, the high-k dielectric material may include at least one of, for example, hafnium oxide ($HfO_2$), hafnium silicon oxide ($HfSiO_4$), lanthanum oxide ($La_2O_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$), or lead zinc niobate ($Pb(Zn_{1/3}Nb_{2/3})O_3$).

An interlayer insulating layer 107 may be arranged on the gate electrode 136. The interlayer insulating layer 107 may include an inorganic insulating layer including SiON, $SiO_x$ and/or $SiN_x$, and may include a single layer or a multi-layer.

The thin film transistor 130 may include a source electrode 138S and a drain electrode 138D respectively connected to the source region 132 and the drain region 133 of the semiconductor layer 134. The source electrode 138S and the drain electrode 138D may be respectively electrically connected to the source region 132 and the drain region 133 of the semiconductor layer 134 through contact holes passing through the gate insulating layer 103 and the interlayer insulating layer 107.

Each of the source electrode 138S and the drain electrode 138D may include at least one of Al, Cu, and Ti, and may include a single layer or a multi-layer. In an example embodiment of the present disclosure, each of the source electrode 138S and the drain electrode 138D may have a multi-layered structure of titanium nitride/aluminum/titanium nitride (TiN/Al/TiN).

In the present example embodiment, the data line DL (see FIG. 4) and the driving voltage line PL (see FIG. 4) may be formed on the same layer on which the source electrode 138S and the drain electrode 138D are arranged and may include a material the same as that of the source electrode 138S and the drain electrode 138D.

The thin film transistor 130 may be covered by a protective layer 109. The protective layer 109 may prevent a wiring, etc. including a metal such as aluminum (Al), which may be damaged by an etchant, from being exposed to an etching environment during a process of manufacturing the display device 1. The protective layer 109 may extend to the non-display area NDA.

A planarization layer 113 is arranged on the protective layer 109 and includes an organic insulating material. The organic insulating material may include, for example, an imide-based polymer, a general-purpose polymer such as polymethylmethacrylate (PMMA) and polystyrene (PS), polymer derivatives having a phenol-based group, an acryl-based polymer, an aryl ether-based polymer, an amide-based polymer, a fluorine-based polymer, a p-xylene-based polymer, a vinyl alcohol-based polymer, or a blend thereof. In an example embodiment of the present disclosure, the planarization layer 113 may include polyimide.

A pixel electrode 210 is arranged on the planarization layer 113. A pixel-defining layer 120 is arranged on the pixel electrode 210 and may include an opening corresponding to each sub-pixel. The pixel-defining layer 120 may define a pixel area, that is, may define an emission area PXA (see FIG. 8) by including an opening that exposes at least a central portion of the pixel electrode 210. Also, the pixel-defining layer 120 may prevent an arc, etc. from occurring between the pixel electrode 210 and the common electrode 230 by increasing a distance between an edge of the pixel electrode 210 and the common electrode 230. The pixel-defining layer 120 may include, for example, an organic material such as polyimide or a silicon containing material such as hexamethyldisiloxane (HMDSO).

An intermediate layer 220 is arranged between the pixel electrode 210 and the common electrode 230, and may include a low molecular weight material or a polymer material.

In the case where the intermediate layer 220 includes a low molecular weight material, the intermediate layer 220 may have a structure in which a hole injection layer (HIL), a hole transport layer (HTL), an emission layer (EML), an electron transport layer (ETL), an electron injection layer (EIL), etc. are stacked in a single or a composite configuration. The emission layer EML may generate a color light corresponding to a pixel, and may be interposed between the hole transport layer HTL and the electron transport layer ETL. The intermediate layer 220 may include various organic materials such as, for example, copper phthalocyanine (CuPc), N,N'-Di(naphthalene-1-yl)-N,N'-diphenyl-benzidine (NPB), and tris-8-hydroxyquinoline aluminum (Alq3). These layers may be formed by vacuum deposition.

In the case where the intermediate layer 220 includes a polymer material, the intermediate layer 220 may have a structure including an HTL and an EML. In this case, the HTL may include PEDOT, and the EML may include a polymer material such as a polyphenylene vinylene (PPV)-based material and/or a polyfluorene-based material.

The structure of the intermediate layer 220 is not limited thereto and may be various structures. For example, at least one of layers constituting the intermediate layer 220 may be formed as one body like the common electrode 230. Alternatively, the intermediate layer 220 may include a patterned layer corresponding to each of the plurality of pixel electrodes 210.

The common electrode 230 may be arranged in the display area DA and may be arranged on an entire surface of the display area DA. For example, the common electrode 230 may be formed as one body to cover a plurality of pixels. The common electrode 230 may extend to a portion of the non-display area NDA, and may cover the valley portion VP.

In an example embodiment of the present disclosure, the display unit 10 may be arranged in the display area DA and may include a light-emitting element such as the light-emitting diode 200 electrically connected to the thin film transistor 130. The light-emitting element may include a pixel electrode 210, a common electrode 230 arranged on the pixel electrode 210, and an emission layer EML arranged between the pixel electrode 210 and the common electrode 230. The pixel-defining layer 120 may be arranged on the planarization layer 113 and including an opening defining an emission area PXA (see FIG. 8) of the light-emitting element.

An encapsulation unit 150 may entirely cover the display area DA and extend to the non-display area NDA to cover a portion of the non-display area NDA. The encapsulation unit 150 may extend to the outside of the common voltage supply line 70, and may be arranged on the common electrode 230.

The encapsulation unit 150 may include a first inorganic encapsulation layer 151, a second inorganic encapsulation layer 153, and an organic encapsulation layer 152 arranged therebetween. In this case, the encapsulation unit 150 that extends to the outside of the common voltage supply line 70 includes the first inorganic encapsulation layer 151 and the second inorganic encapsulation layer 153. The organic encapsulation layer 152 may not extend to the outside of the common voltage supply line 70. In an example embodiment of the present disclosure, the encapsulation unit 150 may include at least one inorganic layer and at least one organic layer, and may be arranged on the light-emitting element such as the light-emitting diode 200 to encapsulate the light-emitting element.

Figure 8:
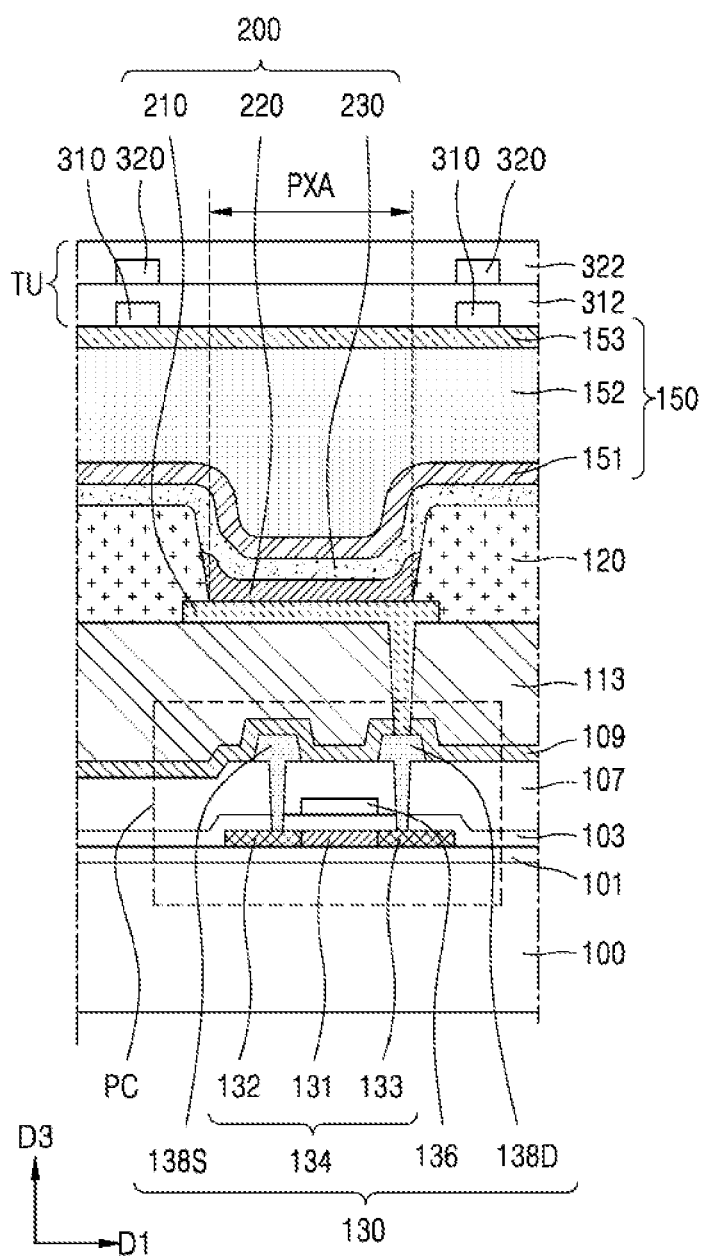
FIG. 8 is a cross-sectional view of a portion of a display area DA of FIG. 7.

The touch unit TU may be arranged on the encapsulation unit 150 (see FIG. 8). For example, the touch unit TU may be directly arranged on the encapsulation unit 150. Depending on a case, an inorganic insulating layer may be arranged on the encapsulation unit 150, and the touch unit TU may be directly arranged on the inorganic insulating layer (see FIGS. 10-12).

Referring to FIG. 8, structures of the display panel DP and the touch unit TU corresponding to the display area DA are shown.

The touch unit TU includes a first conductive layer 310, a second conductive layer 320 arranged over the first conductive layer 310, a first insulating layer 312 arranged between the first conductive layer 310 and the second conductive layer 320, and a second insulating layer 322 arranged on the second conductive layer 320. The first conductive layer 310 and the second conductive layer 320 may respectively correspond to the first conductive layer CL1 and the second conductive layer CL2 of FIG. 5, and the first insulating layer 312 and the second insulating layer 322 may respectively correspond to the first insulating layer IL1 and the second insulating layer IL2 of FIG. 5.

The first conductive layer 310 and the second conductive layer 320 may correspond to the first sensing electrodes IE1-1, IE1-2, IE1-3, IE1-4, and IE1-5 of FIG. 6. As described above, since the first sensing electrodes IE1-1, IE1-2, IE1-3, IE1-4, and IE1-5 and the second sensing electrodes IE2-1, IE2-2, IE2-3, and IE2-4 do not overlap the emission areas PXA, the first sensing electrodes IE1-1, IE1-2, IE1-3, IE1-4, and IE1-5 and the second sensing electrodes IE2-1, IE2-2, IE2-3, and IE2-4 are not viewed by a user. The first conductive layer 310 and the second conductive layer 320 may be electrically connected to each other through a contact hole defined in the first insulating layer 312 in a partial area.

Referring to the non-display area NDA of FIG. 7, a plurality of dummy pixels DPX may be adjacent to the light-emitting diode 200. The dummy pixels DPX do not actually emit light and may include, for example, a patterned intermediate layer. The dummy pixels DPX may be located between the display area DA and a driving circuit area DPC-A.

The driving circuit area DPC-A is located in the non-display area NDA. For example, the first scan driver 20 is arranged in the driving circuit area DPC-A. The first scan driver 20 may include thin film transistors TFT-P and a wiring connected to the thin film transistors TFT-P. The thin film transistor TFT-P may be formed during a process the same as a process of forming the thin film transistor TFT of the pixel circuit PC. The thin film transistor TFT-P may be covered by the protective layer 109. The buffer layer 101, the gate insulating layer 103, the interlayer insulating layer 107, and the protective layer 109 may extend to the non-display area NDA. The buffer layer 101, the gate insulating layer 103, the interlayer insulating layer 107, and the protective layer 109 may each include an inorganic insulating material. The planarization layer 113 may be arranged on the protective layer 109 and may include an organic insulating material.

The first scan driver 20 may be covered by the protective layer 109. The protective layer 109 may prevent a wiring, etc. including a metal such as aluminum (Al), which may be damaged by an etchant, from being exposed to an etching environment during a process of manufacturing the display device 1. It is shown in FIG. 7 that the protective layer 109 is also arranged in the display area DA.

The protective layer 109 may include an inorganic material such as, for example, SiOx, SiNx and/or SiON and may include a single layer or a multi-layer. In an example embodiment of the present disclosure, the protective layer 109 may include SiNx. The protective layer 109 may have a thickness ranging from about 500 Å to about 10,000 Å.

A first dam unit DM1 and a second dam unit DM2 are arranged on the protective layer 109. The first dam unit DM1 and the second dam unit DM2 may surround the outside of the display area DA in a plan view. For example, the first dam unit DM1 may surround the outside of the display area DA, and the second dam unit DM2 may surround the outside of the first dam unit DM1. The first dam unit DM1 and the second dam unit DM2 may prevent the organic encapsulation layer 152 of the encapsulation unit 150 from overflowing to the outside of the substrate 100.

The first dam unit DM1 may be located over the common voltage supply line 70, and the second dam unit DM2 may be located on one side of the first dam unit DM1 to cover an end of the common voltage supply line 70. One end 75A of a conductive layer 75 may be arranged between the first dam unit DM1 and the common voltage supply line 70. The conductive layer 75 may electrically connect the common voltage supply line 70 and the common electrode 230 to allow a common voltage to be transferred to the common electrode 230. Here, the one end 75A of the conductive layer 75 may include the portion of the conductive layer 75 directly connecting to the common voltage supply line 70 and extending to the end of the conductive layer 75.

Although it is shown in FIG. 7 that the first dam unit DM1 has a double-layered structure and the second dam unit DM2 has a triple-layered structure, the present disclosure is not limited thereto. For example, in an example embodiment of the present disclosure, the first dam unit DM1 and the second dam unit DM2 may have a single-layered structure or a triple or more layered structure.

An insulating layer ILL is arranged on the protective layer 109. The insulating layer ILL may include a first insulating layer ILL1 and a second insulating layer ILL2. The first insulating layer ILL1 may be arranged on the protective layer 109, and the second insulating layer ILL2 may be arranged over the first insulating layer ILL1. The conductive layer 75 may be located between the first insulating layer ILL1 and the second insulating layer ILL2.

The first insulating layer ILL1 may be an extended portion of the planarization layer 113 in the display area DA, and the second insulating layer ILL2 may be an extended portion of the pixel-defining layer 120 in the display area DA. Thus, the first insulating layer ILL1 and the planarization layer 113 may be formed in the same process, and the second insulating layer ILL2 and the pixel-defining layer 120 may be formed in the same process. Therefore, the first insulating layer ILL1 may include a layer and a material the same as those of the planarization layer 113, and the second insulating layer ILL2 may include a layer and a material the same as those of the pixel-defining layer 120.

The valley portion VP may be defined as a portion of the insulating layer ILL. The valley portion VP may be formed by removing a portion of the first insulating layer ILL1 and the second insulating layer ILL2. Since the insulating layer ILL includes, for example, an organic insulating material, the insulating layer ILL is vulnerable to external moisture transmission. Therefore, impurities that may be introduced to the display area DA through the insulating layer ILL may be blocked by removing a portion of the insulating layer ILL outside the display area DA.

Although it is shown in FIG. 7 that the valley portion VP is provided on the driving circuit area DPC-A, the present disclosure is not limited thereto. For example, in an example embodiment of the present disclosure, the valley portion VP may not overlap the driving circuit area DPC-A.

The touch unit TU is also arranged over the valley portion VP. The touch unit TU corresponding to the non-display area NDA over the valley portion VP is described in detail with reference to FIG. 10.

Figure 9:
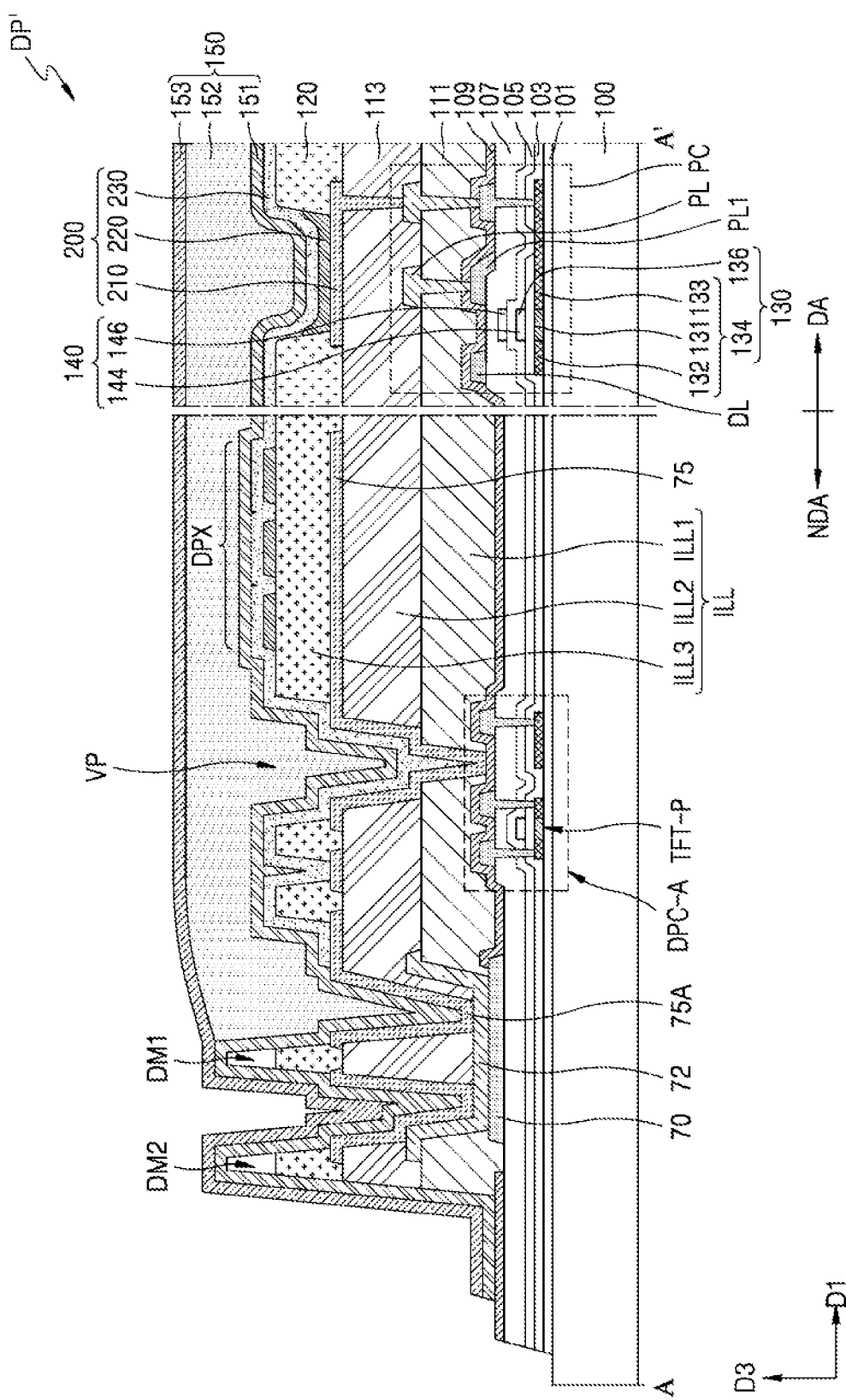
FIG. 9 is a cross-sectional view of a display panel of a display device according to an example embodiment of the present disclosure.

FIG. 9 is a cross-sectional view of a display panel DP' of a display device according to an example embodiment of the present disclosure. FIG. 9 is a modified example embodiment of FIG. 7 and is different from FIG. 7 in the structure of the display element layer below the light-emitting diode 200. Hereinafter, repeated description with reference to FIG. 7 is omitted and a difference is mainly described.

Referring to the display area DA of FIG. 9, the storage capacitor 140 includes first and second storage capacitor plates 144 and 146 overlapping each other. A first interlayer insulating layer 105 may be arranged between the first and second storage capacitor plates 144 and 146. The first interlayer insulating layer 105 is a layer having a predetermined dielectric constant, may include an inorganic insulating layer including, for example, SiON, SiOx, and/or SiNx, and may include a single layer or a multi-layer.

FIG. 9 shows the case where the storage capacitor 140 overlaps the thin film transistor 130, and the first storage capacitor plate 144 serves as the gate electrode 136 of the thin film transistor 130. However, the present disclosure is not limited thereto. For example, in an example embodiment of the present disclosure, the storage capacitor 140 may not overlap the thin film transistor 130, and the first storage capacitor plate 144 may be a separate element independent of the gate electrode 136 of the thin film transistor 130.

A second interlayer insulating layer 107 may be arranged on the storage capacitor 140. The second interlayer insulating layer 107 may include an inorganic insulating layer including, for example, SiON, SiOx, and/or SiNx, and may include a single layer or a multi-layer.

The driving voltage line PL (see FIGS. 3 and 4) may be arranged on a first planarization layer 111. The first planarization layer 111 may be arranged on the protective layer 109 and may include an organic insulating material. The driving voltage line PL may include at least one of Al, Cu, and Ti, and may include a single layer or a multi-layer. In an example embodiment of the present disclosure, the driving voltage line PL may have a multi-layered structure of Ti/Al/Ti.

FIG. 9 shows the structure in which a lower driving voltage line PL1 arranged below the first planarization layer 111 is further provided. The lower driving voltage line PL1 may be electrically connected to the driving voltage line PL through a contact hole passing through the first planarization layer 111 to prevent a voltage drop of the driving voltage ELVDD provided through the driving voltage line PL.

The lower driving voltage line PL1 may include a material the same as that of the data line DL. For example, the lower driving voltage line PL1 and the data line DL may include at least one of, for example, Al, Cu, and Ti, and may include a single layer or a multi-layer. In an example embodiment of the present disclosure, the lower driving voltage line PL1 and the data line DL may have a multi-layered structure of Ti/Al/Ti or titanium nitride/aluminum/titanium (TiN/Al/Ti).

The first planarization layer 111 includes an organic insulating material. The organic insulating material may include, for example, an imide-based polymer, a general-purpose polymer such as polymethylmethacrylate (PMMA) and polystyrene (PS), polymer derivatives having a phenol-based group, an acryl-based polymer, an aryl ether-based polymer, an amide-based polymer, a fluorine-based polymer, a p-xylene-based polymer, a vinyl alcohol-based polymer, or a blend thereof. In an example embodiment of the present disclosure, the first planarization layer 111 may include polyimide.

The driving voltage line PL is covered by a second planarization layer 113. The second planarization layer 113 may include an organic insulating material such as, for example, an imide-based polymer, a general-purpose polymer such as polymethylmethacrylate (PMMA) and polystyrene (PS), polymer derivatives having a phenol-based group, an acryl-based polymer, an aryl ether-based polymer, an amide-based polymer, a fluorine-based polymer, a p-xylene-based polymer, a vinyl alcohol-based polymer, or a blend thereof. In an example embodiment of the present disclosure, the second planarization layer 113 may include polyimide.

The pixel electrode 210 is arranged on the second planarization layer 113. The pixel-defining layer 120 may be arranged on the pixel electrode 210, and may define an emission area PXA by including an opening corresponding to each sub-pixel, that is, an opening that exposes at least a central portion of the pixel electrode 210.

Referring to the non-display area NDA of FIG. 9, the first dam unit DM1 and the second dam unit DM2 are arranged on an outermost portion of the substrate 100 in the non-display area NDA. The first dam unit DM1 and the second dam unit DM2 may surround the outside of the display area DA in a plan view. For example, the first dam unit DM1 may surround the outside of the display area DA, and the second dam unit DM2 may surround the outside of the first dam unit DM1.

The first dam unit DM1 and the second dam unit DM2 may prevent the organic encapsulation layer 152 of the encapsulation unit 150 from overflowing to the outside of the substrate 100. Although it is shown in FIG. 9 that the first dam unit DM1 has three-layered structure and the second dam unit DM2 has a four-layered structure, the present disclosure is not limited thereto. For example, in an example embodiment of the present disclosure, the first dam unit DM1 and the second dam unit DM2 may have a single-layered structure, a double-layered structure or a five or more layered structure.

The first dam unit DM1 may be located over the common voltage supply line 70, and the second dam unit DM2 may be located on one side of the first dam unit DM1 to cover an end of the common voltage supply line 70. A connection line 72 may be arranged between the first dam unit DM1 and the common voltage supply line 70. For example, the connection line 72 may include a material the same as that of the driving voltage line PL of the display area DA.

The conductive layer 75 may be arranged between the second insulating layer ILL2 and a third insulating layer ILL3. One end 75A of the conductive layer 75 may extend to the second dam unit DM2. One side of the conductive layer 75 may contact the common electrode 230 extending to the non-display area NDA, and another side of the conductive layer 75 may contact the connection line 72 to electrically connect the common voltage supply line 70 and the common electrode 230, thereby transferring the common voltage to the common electrode 230.

The insulating layer ILL is arranged on the protective layer 109, and may include the first insulating layer ILL1, the second insulating layer ILL2, and the third insulating layer ILL3. The first insulating layer ILL1 may be arranged on the protective layer 109, the second insulating layer ILL2 may be arranged on the first insulating layer ILL1, and the third insulating layer ILL3 may be arranged over the second insulating layer ILL2.

The first insulating layer ILL1 may include an extended portion of the first planarization layer 111 of the display area DA, the second insulating layer ILL2 may include an extended portion of the second planarization layer 113 of the display area DA, and the third insulating layer ILL3 may include an extended portion of the pixel-defining layer 120 of the display area DA. Thus, the first insulating layer ILL1 and the first planarization layer 111 may be formed in the same process, the second insulating layer ILL2 and the second planarization layer 113 may be formed in the same process, and the third insulating layer ILL3 and the pixel-defining layer 120 may be formed in the same process. Therefore, the first insulating layer ILL1 may include a layer and a material the same as those of the first planarization layer 111, the second insulating layer ILL2 may include a layer and a material the same as those of the second planarization layer 113, and the third insulating layer ILL3 may include a layer and a material the same as those of the pixel-defining layer 120.

The valley portion VP may be defined as a partial area of the insulating layer ILL, and may be formed by removing a portion of the first insulating layer ILL1, the second insulating layer ILL2, and the third insulating layer ILL3. Since the insulating layer ILL includes, for example, an organic insulating material, the insulating layer ILL is vulnerable to external moisture transmission. Therefore, impurities that may be introduced to the display area DA through the insulating layer ILL may be blocked by removing a portion of the insulating layer ILL outside the display area DA.

Although it is shown in FIG. 9 that the valley portion VP is provided over the driving circuit area DPC-A, the present disclosure is not limited thereto. For example, in an example embodiment of the present disclosure, the valley portion VP may be formed not to overlap the driving circuit area DPC-A.

The touch unit TU is arranged over the valley portion VP. The valley portion VP and the touch unit TU corresponding to the non-display area NDA over the valley portion VP are described in detail with reference to FIG. 10.

Figure 10:
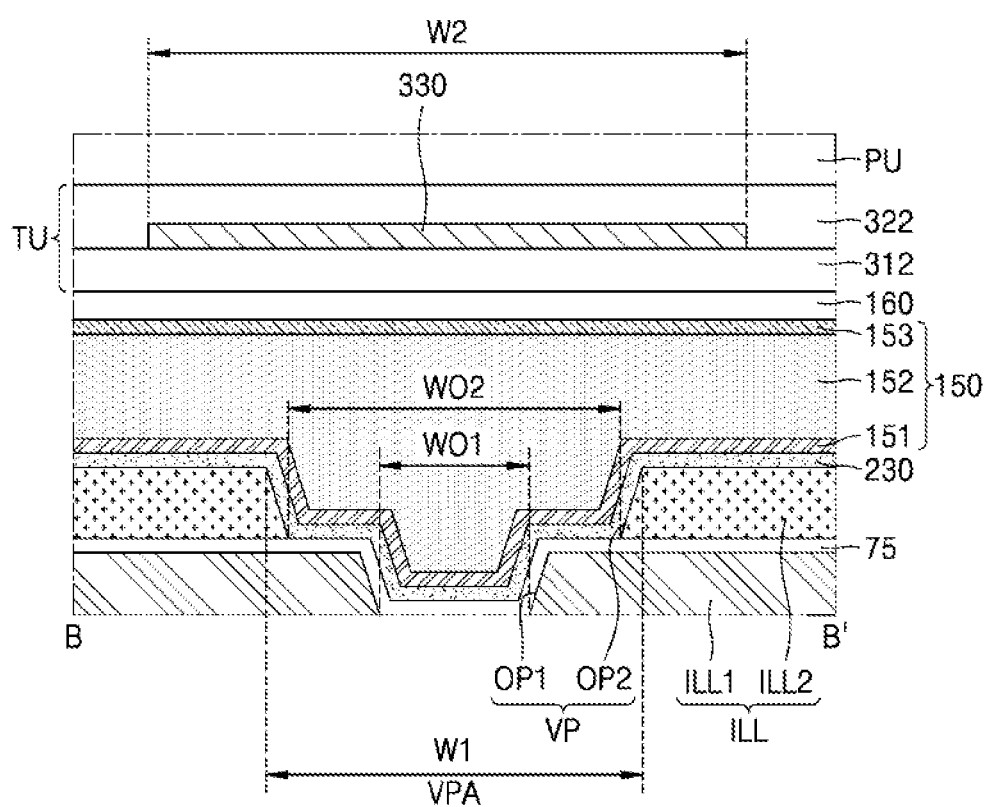
FIGS. 10 and 11 are cross-sectional views of a portion of a display device each according to an example embodiment of the present disclosure.
Figure 11:
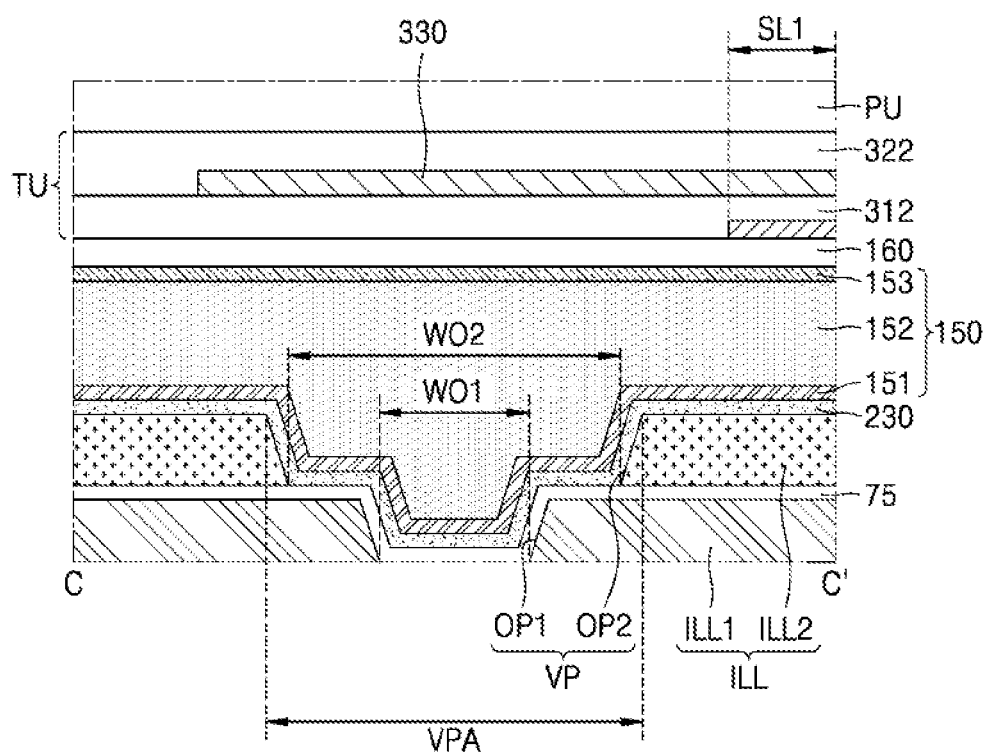
Figure 12:
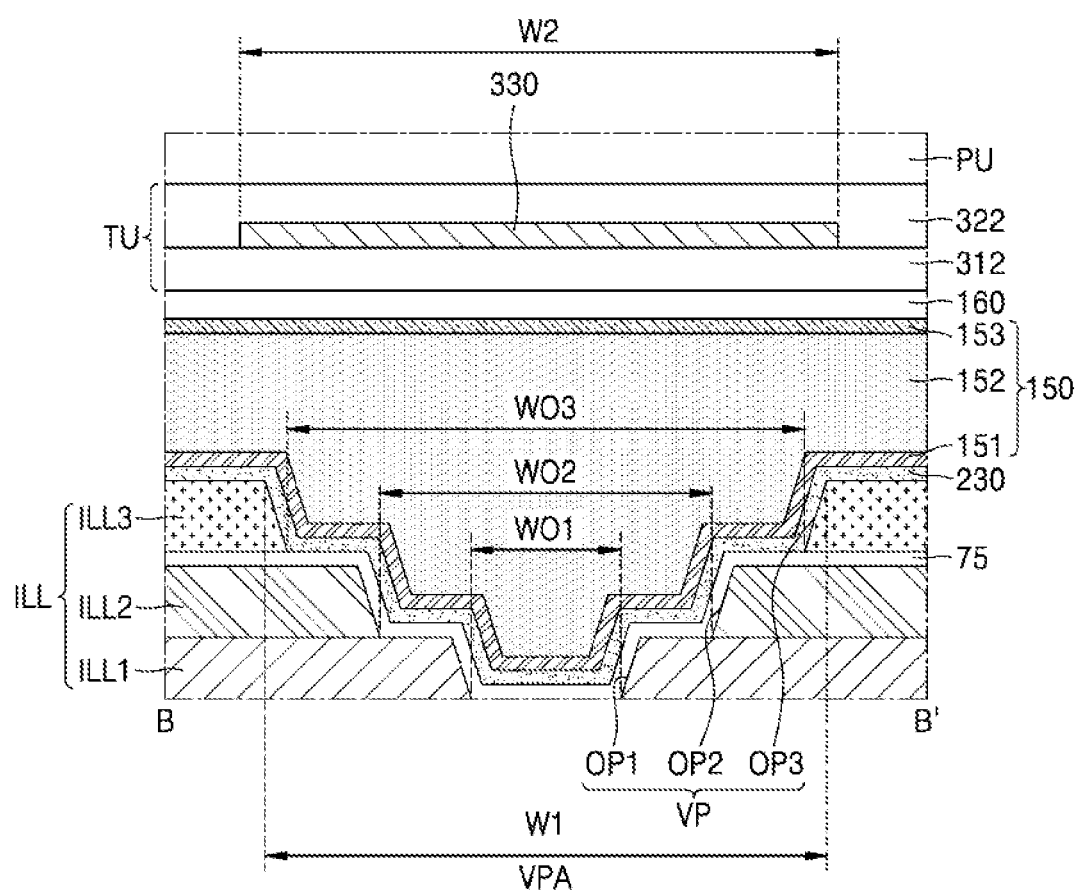
FIG. 12 is a cross-sectional view of a portion of a display device according to an example embodiment of the present disclosure.

FIGS. 10 and 11 are cross-sectional views of a portion of a display device each according to an example embodiment of the present disclosure. FIG. 12 is a cross-sectional view of a portion of a display device according to an example embodiment of the present disclosure. FIGS. 10 and 11 correspond to the valley portion VP of FIG. 7, and FIG. 12 corresponds to the valley portion VP of FIG. 9.

FIGS. 10 to 12 show the structure in which the touch unit TU is arranged over the encapsulation unit 150 with an inorganic layer 160 disposed therebetween. Alternatively, the touch unit TU may be arranged directly on the second inorganic encapsulation layer 153. The polarization unit PU may be arranged on the touch unit TU.

Referring to FIGS. 10 and 11, the valley portion VP may be located in the insulating layer ILL. The valley portion VP is formed by removing a portion of the insulating layer ILL. A portion in which the valley portion VP is formed may be defined as a valley area VPA.

The valley portion VP may include a first opening OP1 defined in the first insulating layer ILL1 and a second opening OP2 defined in the second insulating layer ILL2. A width WO2 of the second opening OP2 may be greater than a width WO1 of the first opening OP1. Therefore, the valley portion VP may have a stepped structure of two or more steps. The valley portion VP may have, for example, an irregular shape or a stepwise shape.

An inner surface of each of the first and second openings OP1 and OP2 constituting the valley portion VP may be provided in a tapered inclined surface. Since it is very difficult to form an inner surface of the opening at an exact 90° during a process of patterning the opening in the insulating layer, inner surfaces of most of the openings have tapered inclined surfaces.

Since light introduced from the outside is reflected by an inclined surface and/or a step difference of the valley portion VP due to such a shape of the valley portion VP and thus the polarization of the light changes, light leakage may occur in which the light is not absorbed by the polarization unit PU and leaks out to the outside.

The display device according to the present example embodiment may prevent light leakage, in which polarized light leaks out to the outside due to the valley portion VP, by covering the valley portion VP with a reflection prevention unit 330 of the touch unit TU arranged over the display panel DP.

The reflection prevention unit 330 may include a layer and a material the same as those of the first conductive layer 310 (see FIG. 8) and/or the second conductive layer 320 (see FIG. 8) of the touch unit TU. Although FIGS. 10 and 11 show the structure in which the reflection prevention unit 330 includes a layer and a material the same as those of the second conductive layer 320 of the touch unit TU, the present disclosure is not limited thereto. For example, in an example embodiment of the present disclosure, the reflection prevention unit 330 may include a layer and a material the same as those of the first conductive layer 310 of the touch unit TU. Also, in an example embodiment of the present disclosure, the reflection prevention unit 330 may be arranged in a double layer and may include layers and materials the same as those of the first and second conductive layers 310 and 320 of the touch unit TU.

A width W2 of the reflection prevention unit 330 may be greater than a width W1 of the valley portion VP. Since the reflection prevention unit 330 is designed for covering the valley portion VP from external light, it is preferable that the reflection prevention unit 330 has a greater width than that of the valley portion VP. As a comparative example, it may be assumed that the width W2 of the reflection prevention unit 330 is the same as the width W1 of the valley portion VP. In this case, obliquely incident light cannot be blocked and thus light leakage may occur. In other words, the reflection prevention unit 330 not only requires to overlap the entire valley portion VP, but also requires an additional area surrounding the portion overlapping the valley portion VP to block obliquely incident light. For example, in an example embodiment of the present disclosure, in a plan view, the reflection prevention unit 330 may include at least a first portion which overlaps an entirety of the valley portion VP, and a second portion which surrounds the first portion and does not overlap the valley portion VP.

FIG. 10 shows the case where the reflection prevention unit 330 is provided as a separate dummy layer DML (see FIGS. 13 to 15), and FIG. 11 shows the case where the reflection prevention unit 330 is provided as an extended portion of a wiring unit, for example, a signal line SL, a guard line GDL, an electrostatic discharge prevention line ESL, etc. (see FIGS. 16 to 18), which are described in detail with reference to FIGS. 13 to 18. In an example embodiment of the present disclosure, the reflection prevention unit 330 may include at least one of a part of the signal line SL, a part of the guard line GDL, a part of the electrostatic discharge prevention line ESL, and a part of the dummy layer DML arranged on one side of the signal line SL.

Referring to FIG. 6, in an example embodiment of the present disclosure, the dummy layer DML may be arranged between a first signal line (e.g., SL1-1) arranged at an outermost portion among the plurality of first signal lines (e.g., SL1-1, SL1-2, SL1-3, SL1-4, and SL1-5), and a second signal line (e.g., SL2-1) arranged at an outermost portion among the plurality of second signal lines (e.g., SL2-1, SL2-2, SL2-3, and SL2-4).

Referring to FIG. 12, the valley portion VP is located in the insulating layer ILL. The valley portion VP is formed by removing a portion of the insulating layer ILL, and a portion in which the valley portion VP is formed may be defined as a valley area VPA.

The valley portion VP may include a first opening OP1 defined in the first insulating layer ILL1, a second opening OP2 defined in the second insulating layer ILL2, and a third opening OP3 defined in the third insulating layer ILL3. A width WO2 of the second opening OP2 may be greater than a width WO1 of the first opening OP1, and a width WO3 of the third opening OP3 may be greater than the width WO2 of the second opening OP2. Therefore, the valley portion VP may have a stepped structure of three or more steps. Also, an inner surface of each of the first to third openings OP1 to OP3 constituting the valley portion VP may be provided in a tapered inclined surface.

The width W2 of the reflection prevention unit 330 may be greater than the width W1 of the valley portion VP. Since the reflection prevention unit 330 is designed for covering the valley portion VP from external light, it is preferable that the reflection prevention unit 330 has a width greater than that of the valley portion VP. Thus, an obliquely incident light may be blocked and light leakage may not occur.

The reflection prevention unit 330 may include a layer or layers and a material or materials the same as those of the first conductive layer 310 (see FIG. 8) and/or the second conductive layer 320 (see FIG. 8) of the touch unit TU. Like FIG. 11, FIG. 12 shows the structure in which the reflection prevention unit 330 may include a layer and a material the same as those of the second conductive layer 320 of the touch unit TU. Also, although FIG. 12 shows the case where the reflection prevention unit 330 is provided as a separate dummy layer, the reflection prevention unit 330 may be provided as an extended portion of, for example, a signal line, a guard line, an electrostatic discharge prevention line, etc. as shown in FIG. 11. In an example embodiment of the present disclosure, at least a portion of the signal line SL may overlap the valley portion VP, and the reflection prevention unit 330 may include at least a portion of the signal line SL.

FIGS. 13 to 18 are plan views of a portion of a display device according to an example embodiment of the present disclosure. FIGS. 13 to 18 may approximately correspond to a portion AA, a portion BB, a portion CC, a portion DD, and a portion EE of FIG. 6, respectively, with FIGS. 16 and 17 both approximately corresponding to a portion DD of FIG. 6. Therefore, in each plan view of FIGS. 13 to 18, a thickness, a shape, and a location of each member may change. Particularly, a width of a signal wiring may change depending on concentration of signal wirings. For example, in an area in which the concentration of signal wirings is low, each of the signal wirings may have a relatively large width. In an area in which the concentration of signal wirings is high, each of the signal wirings may have a relatively small width.

Figure 13:
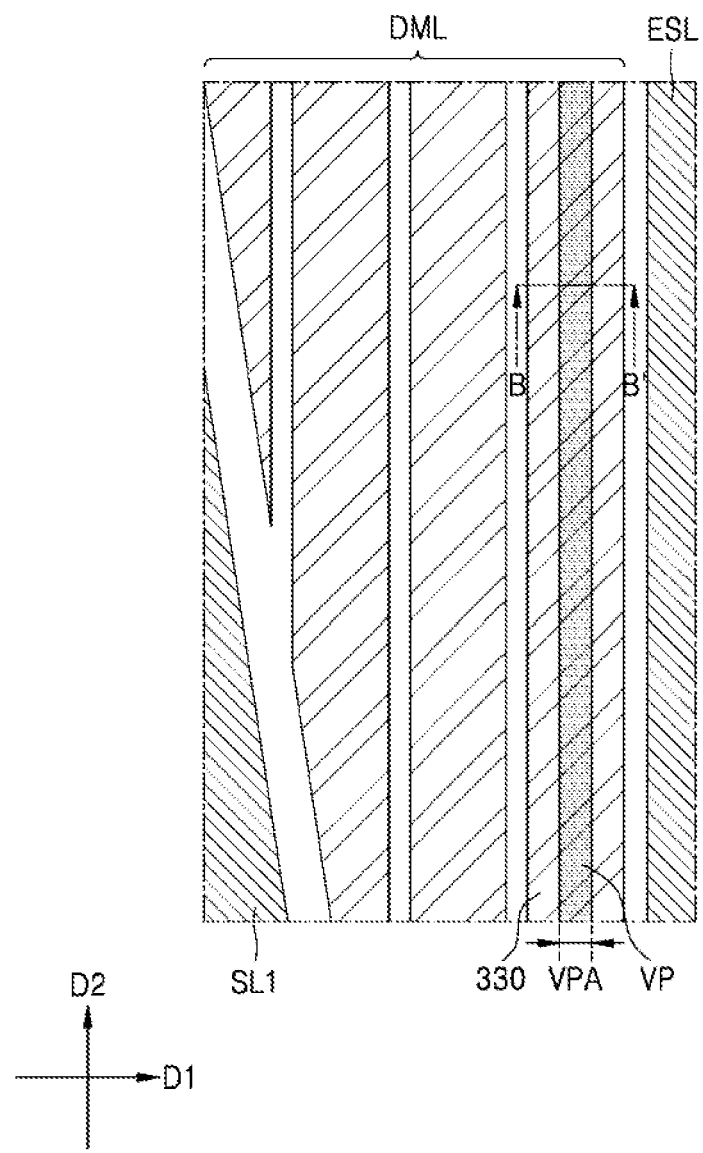
FIGS. 13 to 18 are plan views of a portion of a display device according to an example embodiment of the present disclosure.
Figure 14:
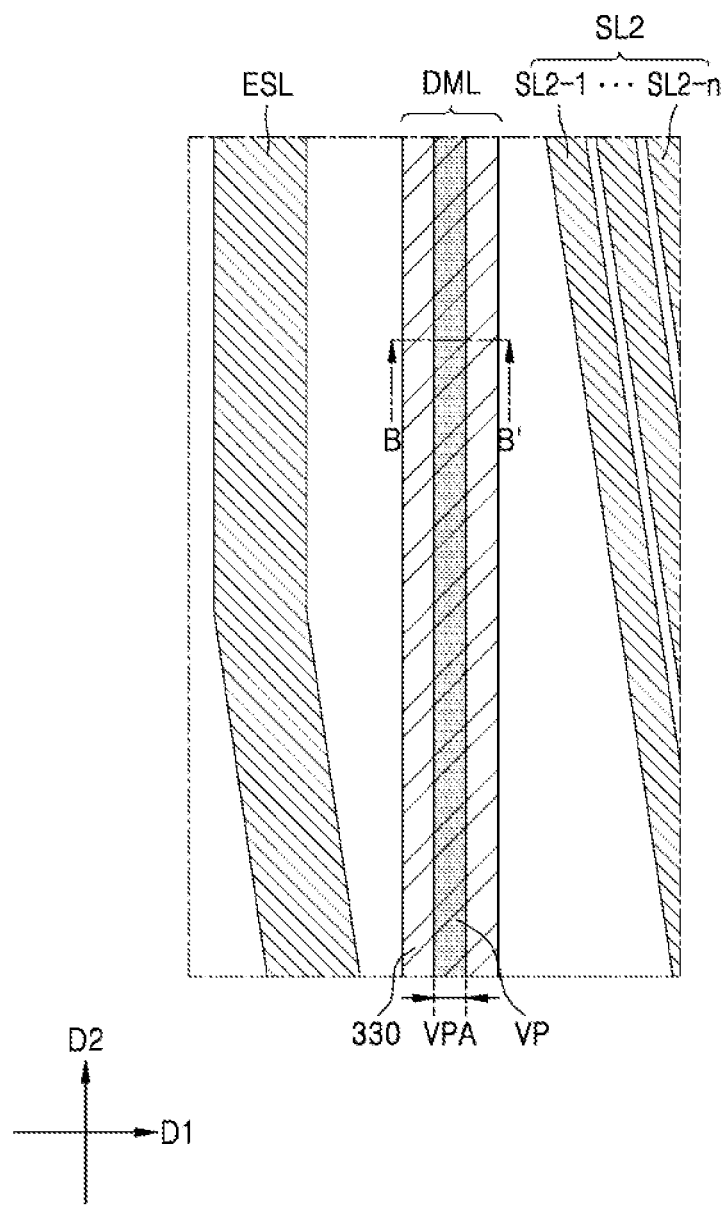
Figure 15:
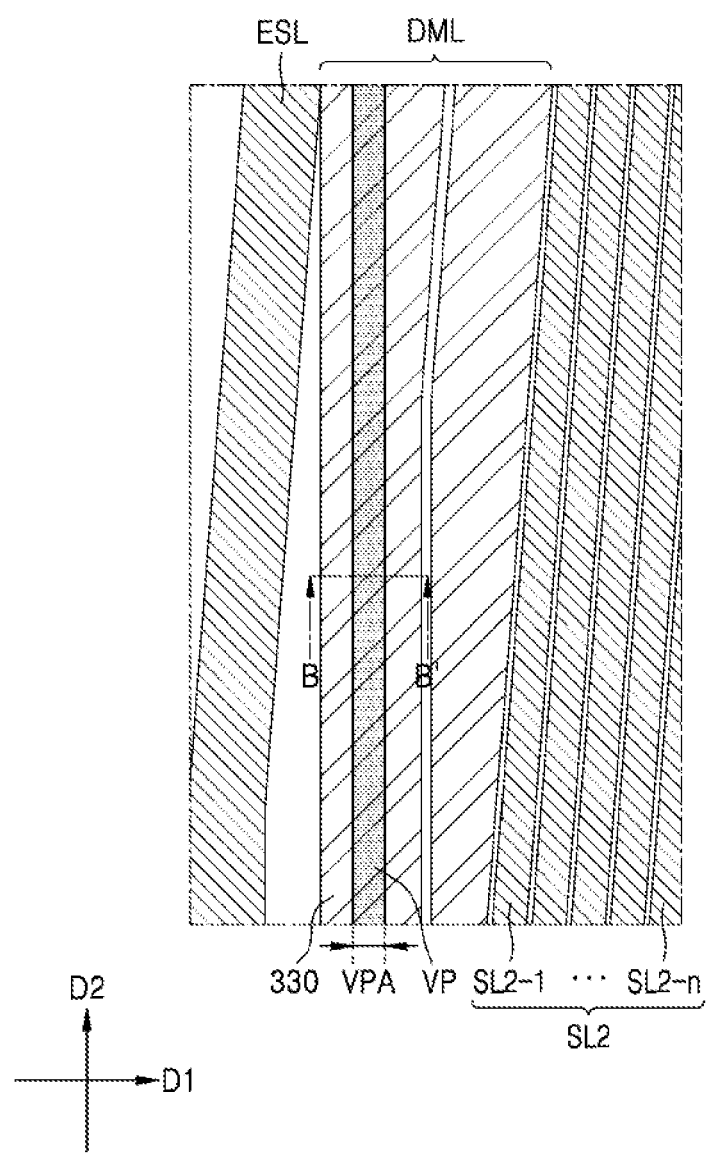
Figure 16:
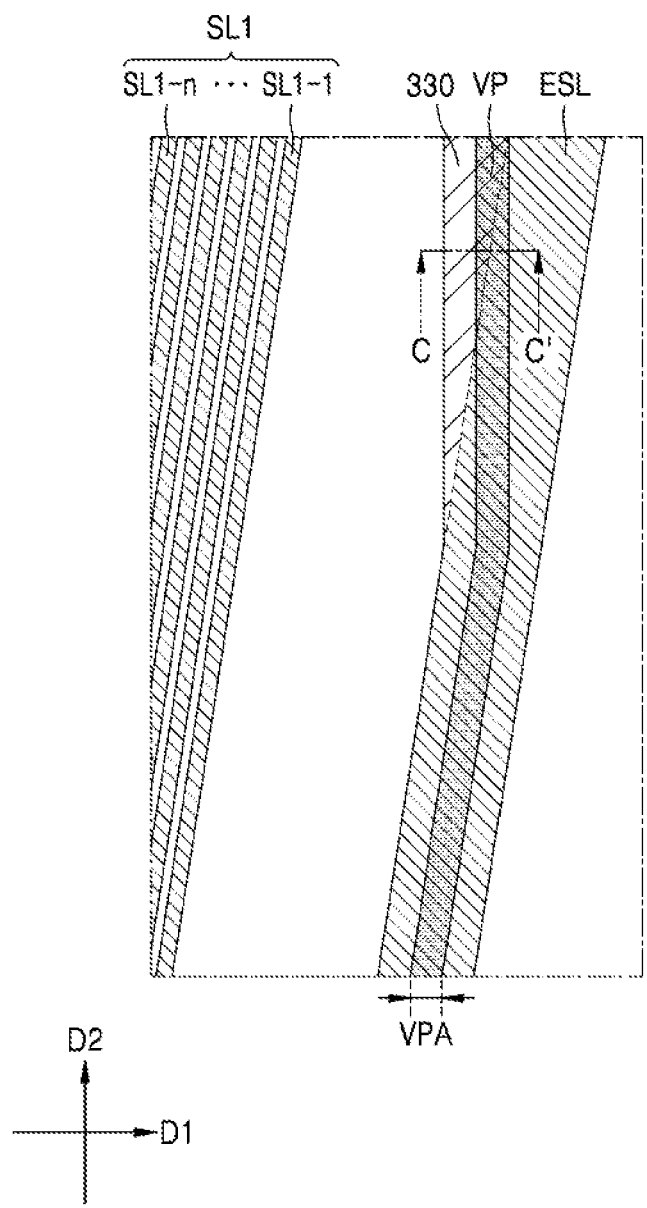
Figure 17:
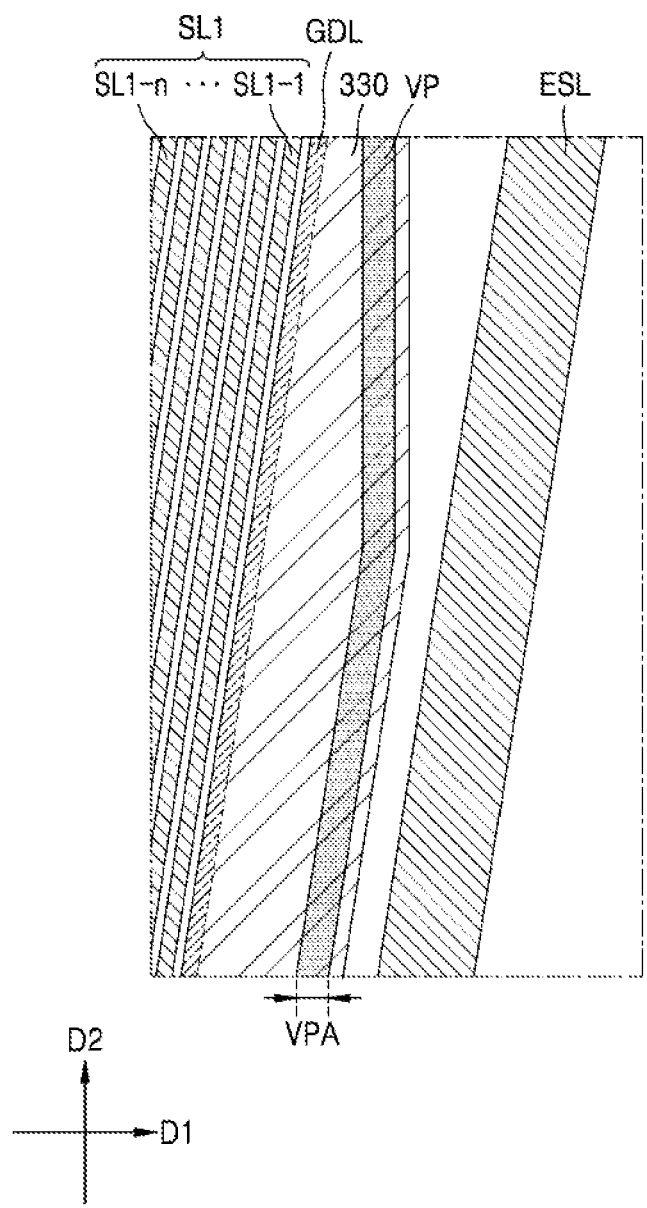
Figure 18:
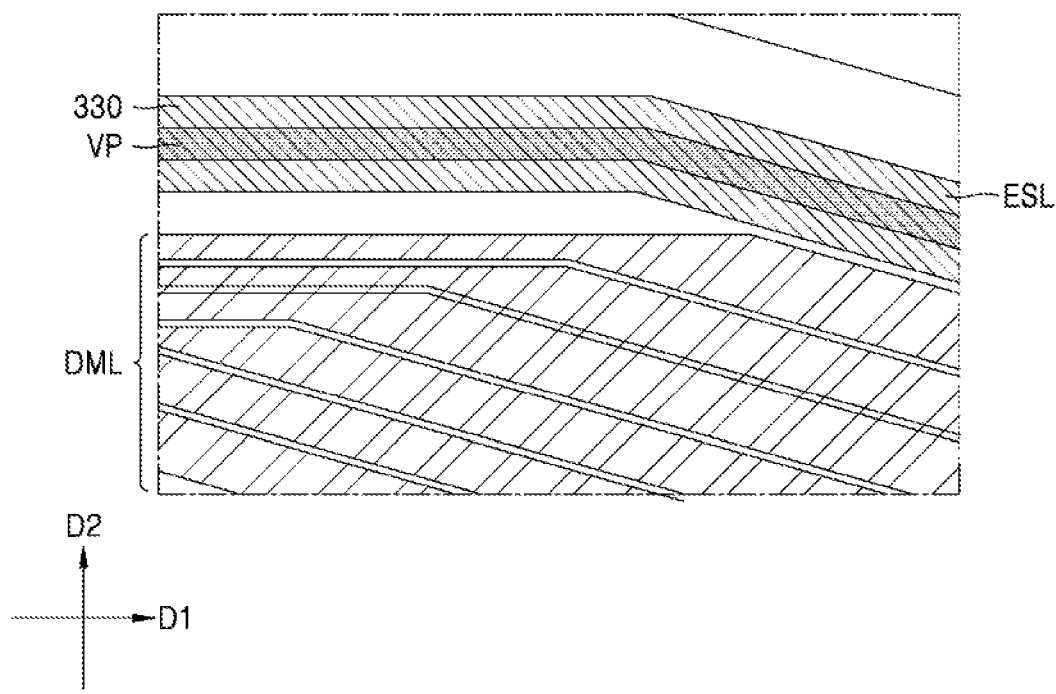

Referring to FIGS. 13 to 18, the reflection prevention unit 330 may include at least a portion of the dummy layer DML, the electrostatic discharge prevention line ESL, and the guard line GDL. FIGS. 13 to 15 show the case where the dummy layer DML is provided as the reflection prevention unit 330, FIGS. 16 and 18 show the case where the electrostatic discharge prevention line ESL is provided as the reflection prevention unit 330, and FIG. 17 show the case where the guard line GDL is provided as the reflection prevention unit 330.

FIG. 13 may approximately correspond to an upper right end, that is, the portion AA of FIG. 6. Also, line B-B' of FIG. 13 may correspond to a cross-section of FIG. 10 or 12.

Referring to FIG. 13, the dummy layer DML is arranged between a first signal line SL1 and the electrostatic discharge prevention line ESL. The dummy layer DML may have an isolated structure without being connected to any wiring.

Referring to FIG. 6, the upper right end of the touch unit TU may be understood as a portion in which the first signal lines SL1-1, SL1-2, SL1-3, SL1-4, and SL1-5 are least arranged. Also, the upper right end of the touch unit TU may be a portion in which the second signal lines SL2-1, SL2-2, SL2-3, and SL2-4 are least arranged. Only the first signal line SL1-1, which is arranged at an outermost portion among the plurality of first signal lines (e.g., SL1-1, SL1-2, SL1-3, SL1-4, and SL1-5), and the second signal line SL2-1, which is arranged at an outermost portion among the plurality of second signal lines (e.g., SL2-1, SL2-2, SL2-3, and SL2-4), may be arranged in a corner area at the upper right end of the touch unit TU. Therefore, compared to a corner area in which the first signal lines SL1-1, SL1-2, SL1-3, SL1-4, and SL1-5 or the second signal lines SL2-1, SL2-2, SL2-3, and SL2-4, which are provided as a plurality of signal lines, are densely arranged, the valley portion VP is directly exposed at the corner area at the upper right end of the touch unit TU. Therefore, the dummy layer DML may be further provided between the first signal line SL1 and the electrostatic discharge prevention line ESL, and between the second signal line SL2 and the electrostatic discharge prevention line ESL in the corner area at the upper right end of the touch unit TU.

In FIG. 13, the dummy layer DML is not arranged as one body to prevent electrostatic discharge and has a shape in which a plurality of pieces are discontinuously arranged. In an example embodiment of the present disclosure, the dummy layer DML may be formed as one body depending on an area of a region in which the dummy layer DML is arranged.

A portion of the dummy layer DML may be provided as the reflection prevention unit 330, and the rest of the dummy layer DML may be provided so as to adjust density of a wiring in an area between the first signal line SL1 and the electrostatic discharge prevention line ESL.

The reflection prevention unit 330 may include the dummy layer DML. In FIG. 13, the valley portion VP located in the valley area VPA is arranged to extend in the second direction D2 and located on one side of the electrostatic discharge prevention line ESL. Since the valley portion VP is covered by the dummy layer DML, an issue that the valley portion VP is visible to the outside by external light reflection may be prevented.

Although it is shown in FIG. 13 that a separate dummy layer DML is provided on the valley portion VP to cover the valley portion VP, the present disclosure is not limited thereto. For example, in an example embodiment of the present disclosure, in the case where the valley portion VP is adjacent to the electrostatic discharge prevention line ESL, a portion of the electrostatic discharge prevention line ESL may extend to cover the valley portion VP.

FIG. 14 may approximately correspond to an upper left end, that is, the portion BB of FIG. 6. Also, FIG. 15 may approximately correspond to a lower left end, that is, the portion CC of FIG. 6. Line B-B' of FIGS. 14 and 15 may correspond to a cross-section of FIG. 10 or 12.

Referring to FIGS. 14 and 15, the dummy layer DML is arranged between the second signal lines SL2-1, SL2-2, SL2-3, and SL2-4 and the electrostatic discharge prevention line ESL. The dummy layer DML may be provided on only the valley portion VP as shown in FIG. 14 and may be provided to fill a space between the second signal lines SL2-1, SL2-2, SL2-3, and SL2-4 and the electrostatic discharge prevention line ESL as shown in FIG. 15.

The reflection prevention unit 330 may include the dummy layer DML or a portion of the dummy layer DML. Like a cross-section of FIG. 10 or 12, the reflection prevention unit 330 may overlap the valley portion VP. The reflection prevention unit 330 may prevent an issue, that the valley portion VP is viewed to the outside by external light reflection, by covering the valley portion VP as described above.

FIG. 16 may approximately correspond to a lower right end, that is, the portion DD of FIG. 6. Also, line C-C' of FIG. 16 may correspond to a cross-section of FIG. 11.

Referring to FIG. 16, the reflection prevention unit 330 may include the electrostatic discharge prevention line ESL. Although the valley portion VP partially overlaps the electrostatic discharge prevention line ESL, a partial area of the valley portion VP does not overlap the electrostatic discharge prevention line ESL. In this case, a portion of the electrostatic discharge prevention line ESL extends to cover the valley portion VP. For example, at least a portion of the electrostatic discharge prevention line ESL may overlap the valley portion VP. In other words, the valley portion VP may be covered by a portion of the electrostatic discharge prevention line ESL.

In FIG. 11, the wiring unit may include at least one of, for example, the signal line SL, the guard line GDL, and the electrostatic discharge prevention line ESL. The wiring unit may include a double layer including the first conductive layer 310 and the second conductive layer 320. The first conductive layer 310 and the second conductive layer 320 that constitute the wiring unit may be connected to each other through a contact hole defined in the first insulating layer 312.

The reflection prevention unit 330 may be provided by extending the second conductive layer 320 of the wiring unit. In FIG. 16, a portion of the second conductive layer 320 of the electrostatic discharge prevention line ESL extends in the first direction D1 to completely cover the valley portion VP.

FIG. 17 is a modified example embodiment of FIG. 16 and shows the case where the reflection prevention unit 330 includes the guide line GDL. FIG. 17 may approximately correspond to a lower right end, that is, the portion DD of FIG. 6.

The guard line GDL may be arranged at an outermost portion of the first signal lines SL1-1, SL1-2, . . . , SL1-$n$, that is, one side of the first signal line SL1-1. The guard line GDL may prevent a signal of the first signal lines SL1-1, SL1-2, . . . , SL1-$n$ from being interfered with a signal of other wirings. For example, the guard line GDL may prevent a signal interference on the signal line SL. Alternatively, the guard line GDL may be arranged at an outermost portion of the second signal lines SL2-1, SL2-2, . . . , SL2-n, and between the first signal lines SL1-1, SL1-2, . . . , SL1-n and the second signal lines SL2-1, SL2-2, . . . , SL2-n.

Since the guard line GDL is arranged at the outermost portion of the first signal lines SL1-1, SL1-2, . . . , SL1-n, a portion of the guard line GDL may extend and may be utilized as the reflection prevention unit 330 as shown in FIG. 17. The guard line GDL may extend in the first direction D1 to the valley portion VP. As described above with reference to FIGS. 11 and 16, the guard line GDL is provided in a double layer including the first conductive layer 310 and the second conductive layer 320, and a portion of the second conductive layer 320 may extend to overlap the valley portion VP. For example, at least a portion of the guard line GDL may overlap the valley portion VP, and the reflection prevention unit 330 may include at least a portion of the guard line GDL. In other words, the valley portion VP may be covered by a portion of the guard line GDL.

Taking into account the above description, a portion of the signal line SL, the guard line GDL, and/or the electrostatic discharge prevention line ESL of the wiring unit that neighbors the valley portion VP may extend and may be utilized as the reflection prevention unit 330 depending on a location of the valley portion VP.

FIG. 18 may approximately correspond to an upper right end, that is, the portion EE of FIG. 6.

Referring to FIG. 18, as described with reference to FIG. 14, the upper right end of the touch unit TU may be understood as a portion in which the first signal lines SL1-1, SL1-2, SL1-3, SL1-4, and SL1-5 are least arranged, also as a portion in which the second signal lines SL2-1, SL2-2, SL2-3, and SL2-4 are least arranged. Therefore, as shown in FIG. 18, the dummy layer DML may be arranged wide inside the electrostatic discharge prevention line ESL.

The reflection prevention unit 330 may include the electrostatic discharge prevention line ESL. As in FIG. 18, the electrostatic discharge prevention line ESL may completely overlap the valley portion VP. Thus, the reflection prevention unit 330 may prevent an issue, that the valley portion VP is viewed to the outside by external light reflection, by covering the valley portion VP as described above.

Since light introduced from the outside is reflected by an inclined surface and/or a step difference of the valley portion VP due to such a shape of the valley portion VP and thus the polarization of the light changes, light leakage may occur in which the light is not absorbed by the polarization unit PU and leaks out to the outside.

The display device according to the present example embodiment may prevent light leakage, in which polarized light leaks out to the outside due to the valley portion VP, by covering the valley portion VP with the reflection prevention unit 330 of the touch unit TU arranged over the display panel DP.

Although up to now, only the display device has been mainly described, the present disclosure is not limited thereto. For example, a method of manufacturing the display device also falls within the scope of the present disclosure.

According to an example embodiment of the present disclosure, the display device in which a defect by external light reflection in the non-display area is minimized may be implemented. However, the scope of the present disclosure is not limited by this effect.

Although the present disclosure has been described with reference to the example embodiments illustrated in the drawings, these example embodiments are merely provided as examples and it will be understood by those of ordinary skill in the art that various changes in form and details and equivalents thereof may be made therein without departing from the spirit and scope of the present disclosure as defined by the appended claims.

What is claimed is:

1. A display device comprising:
a display panel, a touch unit arranged on the display panel, and a window arranged over the touch unit,
wherein the display panel comprises:
a display area, and a non-display area arranged around the display area;
an insulator including a valley portion, the valley portion being defined as an opening arranged along an outer side of the display area in the non-display area;
a display unit arranged in the display area and including a light-emitting element electrically connected to a thin film transistor; and
a thin-film encapsulation layer on the display unit, and
wherein the touch unit comprises:
a wiring layer that overlaps the valley portion and is arranged between the thin-film encapsulation layer and the window.

2. The display device of claim 1, wherein the touch unit is directly arranged on the display panel, and comprises:
a sensing electrode corresponding to the display area; and
a signal line corresponding to the non-display area and electrically connected to the sensing electrode.

3. The display device of claim 2, wherein the sensing electrode comprises:
a first conductive layer;
a second conductive layer arranged over the first conductive layer;
a first insulating layer arranged between the first conductive layer and the second conductive layer; and
a second insulating layer arranged on the second conductive layer.

4. The display device of claim 3, wherein the wiring layer comprises a material the same as that of the second conductive layer.

5. The display device of claim 2, wherein the touch unit further comprises:
an electrostatic discharge prevention line arranged on an outer side of the signal line, with at least a portion of the electrostatic discharge prevention line overlapping the valley portion.

6. The display device of claim 5, wherein the wiring layer comprises at least a portion of the electrostatic discharge prevention line.

7. The display device of claim 5, wherein a constant voltage is applied to the electrostatic discharge prevention line.

8. The display device of claim 5, further comprising a dummy layer between the outer side of the signal line and the electrostatic discharge prevention line, wherein the dummy layer is isolated from the signal line and the electrostatic discharge prevention line.

9. The display device of claim 8, wherein the electrostatic discharge prevention line completely overlaps the valley portion.

10. The display device of claim 1, wherein a width of the wiring layer is greater than a width of the valley portion.

11. The display device of claim 1, wherein the thin-film encapsulation layer comprises:
a first inorganic encapsulation layer;
a second inorganic encapsulation layer arranged over the first inorganic encapsulation layer; and an organic encapsulation layer arranged between the first inorganic encapsulation layer and the second inorganic encapsulation layer, and wherein the touch unit is arranged on the second inorganic encapsulation layer.

12. The display device of claim 1, further comprising a polarization unit between the touch unit and the window.

13. The display device of claim 1, wherein the insulator comprises an organic insulating material.

14. A display device comprising;
a substrate including a display area and a non-display area arranged around the display area;
a display unit arranged in the display area and including a light-emitting element electrically connected to a thin film transistor;
an insulator extending from the display area and including a valley portion defined as an opening arranged along an outer side of the display area, with at least a portion of the insulator being arranged in the non-display area;
a thin-film encapsulation layer including at least one inorganic layer and at least one organic layer and arranged on the light-emitting element to encapsulate the light-emitting element;
a touch unit arranged on the thin-film encapsulation layer and including a sensing electrode corresponding to the display area, a signal line corresponding to the non-display area and connected to the sensing electrode, and an electrostatic discharge prevention line arranged on an outer side of the signal line, with at least a portion of the electrostatic discharge prevention line overlapping the valley portion.

15. The display device of claim 14, wherein a constant voltage is applied to the electrostatic discharge prevention line.

16. The display device of claim 14, further comprising a dummy layer between the outer side of the signal line and the electrostatic discharge prevention line, wherein the dummy layer is isolated from the signal line and the electrostatic discharge prevention line.

17. The display device of claim 16, wherein the electrostatic discharge prevention line completely overlaps the valley portion.

18. The display device of claim 14, wherein a width of the electrostatic discharge prevention line is greater than a width of the valley portion.

19. The display device of claim 14, further comprising a polarization unit between the touch unit and a window.

20. The display device of claim 14, wherein the insulator comprises an organic insulating material.

* * * * *